(12) United States Patent
Koide et al.

(10) Patent No.: US 12,099,295 B2
(45) Date of Patent: Sep. 24, 2024

(54) IMPRINT APPARATUSES AND ARTICLE MANUFACTURING METHODS APPLYING VISCOSITY INCREASES WITHOUT CURING OF IMPRINT MATERIAL

(71) Applicant: CANON KABUSHIKI KAISHA, Tokyo (JP)

(72) Inventors: Hiroyuki Koide, Utsunomiya (JP); Tomomi Funayoshi, Utsunomiya (JP); Kenichi Kobayashi, Utsunomiya (JP); Tatsuya Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 125 days.

(21) Appl. No.: 16/843,677

(22) Filed: Apr. 8, 2020

(65) Prior Publication Data

US 2020/0333704 A1    Oct. 22, 2020

Related U.S. Application Data

(63) Continuation of application No. PCT/JP2018/037705, filed on Oct. 10, 2018.

(30) Foreign Application Priority Data

Oct. 17, 2017 (JP) .................................. 2017-201415
Oct. 23, 2017 (JP) .................................. 2017-204553
(Continued)

(51) Int. Cl.
*G03F 7/00* (2006.01)
*G05B 13/00* (2006.01)
*H01L 21/027* (2006.01)

(52) U.S. Cl.
CPC ........... *G03F 7/0002* (2013.01); *G05B 13/00* (2013.01); *H01L 21/0271* (2013.01)

(58) Field of Classification Search
CPC .. G03F 7/0002; G03F 7/70558; G03F 7/2012; G03F 9/7042; G05B 13/00;
(Continued)

(56) References Cited

U.S. PATENT DOCUMENTS 5,308,998 A * 5/1994 Yamazaki ........... H01L 29/4908
257/E29.151
8,394,282 B2    3/2013 Panga
(Continued)

FOREIGN PATENT DOCUMENTS

CA      2898098 A1 *  8/2014  ............... A61F 2/82
CA      2898103 A1 *  8/2014  ............... A61F 2/82
(Continued)

*Primary Examiner* — Xiao S Zhao
*Assistant Examiner* — Guy F Mongelli
(74) *Attorney, Agent, or Firm* — Canon U.S.A., Inc. IP Division

(57) ABSTRACT

The present invention provides an imprint apparatus forming a pattern of an imprint material on a substrate by using a mold, the imprint apparatus including an optical system applying, to a peripheral region, irradiation light acing to increase viscosity of the imprint material, the peripheral region including an end of a mesa portion of the mold and surrounding the mesa portion in a state in which the mesa portion of the mold is held in contact with the imprint material, and a control unit controlling the optical system such that timings of applying the irradiation light to a plurality of zones in the peripheral region are different from each other, the zones being positioned at different distances from a center of the mesa portion, in the state in which the mesa portion of the mold is held in contact with the imprint material on the substrate.

25 Claims, 23 Drawing Sheets

(30) Foreign Application Priority Data

Sep. 21, 2018 (JP) .................................. 2018-177271
Sep. 21, 2018 (JP) .................................. 2018-177272

(58) Field of Classification Search
CPC . H01L 21/0271; B29C 33/424; B29C 59/002; B29C 59/022; B29C 59/16
See application file for complete search history.

(56) References Cited

U.S. PATENT DOCUMENTS

| | | | |
|---|---|---|---|
| 9,415,418 B2 | 8/2016 | Sreenivasan | |
| 2001/0001247 A1* | 5/2001 | Finders | G03F 7/70125 355/71 |
| 2002/0042027 A1* | 4/2002 | Chou | B82Y 10/00 430/330 |
| 2005/0158210 A1* | 7/2005 | Haga | B01L 3/5085 422/400 |
| 2006/0103719 A1* | 5/2006 | Katzir | G03F 7/70041 347/239 |
| 2006/0273488 A1* | 12/2006 | Seki | B82Y 40/00 264/293 |
| 2008/0220382 A1* | 9/2008 | Veselinovic | G03F 7/70433 399/51 |
| 2009/0025595 A1* | 1/2009 | Mayers | G03F 7/0002 101/493 |
| 2009/0026657 A1* | 1/2009 | Nimmakayala | G03F 9/7049 264/293 |
| 2009/0096133 A1* | 4/2009 | Doyle | B29C 59/16 264/400 |
| 2009/0140445 A1* | 6/2009 | Lu | B29C 43/58 425/149 |
| 2009/0200710 A1 | 8/2009 | Khusnatdinov et al. | |
| 2010/0009294 A1* | 1/2010 | Shih | G03F 7/70425 430/312 |
| 2012/0133914 A1* | 5/2012 | Prosyentsov | G03F 7/70783 355/53 |
| 2013/0078820 A1 | 3/2013 | Mikami | |
| 2013/0234371 A1 | 9/2013 | Yamaguchi et al. | |
| 2013/0241109 A1 | 9/2013 | Khusnatdinov et al. | |
| 2014/0027955 A1* | 1/2014 | Wakabayashi | G03F 7/0002 264/447 |
| 2015/0118847 A1 | 4/2015 | Mikami | |

FOREIGN PATENT DOCUMENTS

| | | |
|---|---|---|
| CN | 101939704 A | 1/2011 |
| CN | 105137713 A | 12/2015 |
| EP | 2240826 A1 | 10/2010 |
| JP | 2007019479 A | 1/2007 |
| JP | 2011-521438 A | 7/2011 |
| JP | 2011-181548 A | 9/2011 |
| JP | 2011183731 A | 9/2011 |
| JP | 2013-69918 A | 4/2013 |
| JP | 2013-069919 A | 4/2013 |
| JP | 2014-027016 A | 2/2014 |
| JP | 2014-188869 A | 10/2014 |
| JP | 2015-106670 A | 6/2015 |
| JP | 2017-147283 A | 8/2017 |
| JP | 2017-147284 A | 8/2017 |
| KR | 10-2010-0123698 A | 11/2010 |
| KR | 10-2016-0054631 A | 5/2016 |
| TW | 200938949 A | 9/2009 |
| TW | 201601197 A | 1/2016 |
| TW | 201637820 A | 11/2016 |
| TW | 201737310 A | 10/2017 |
| WO | 2009099666 A1 | 8/2009 |

\* cited by examiner

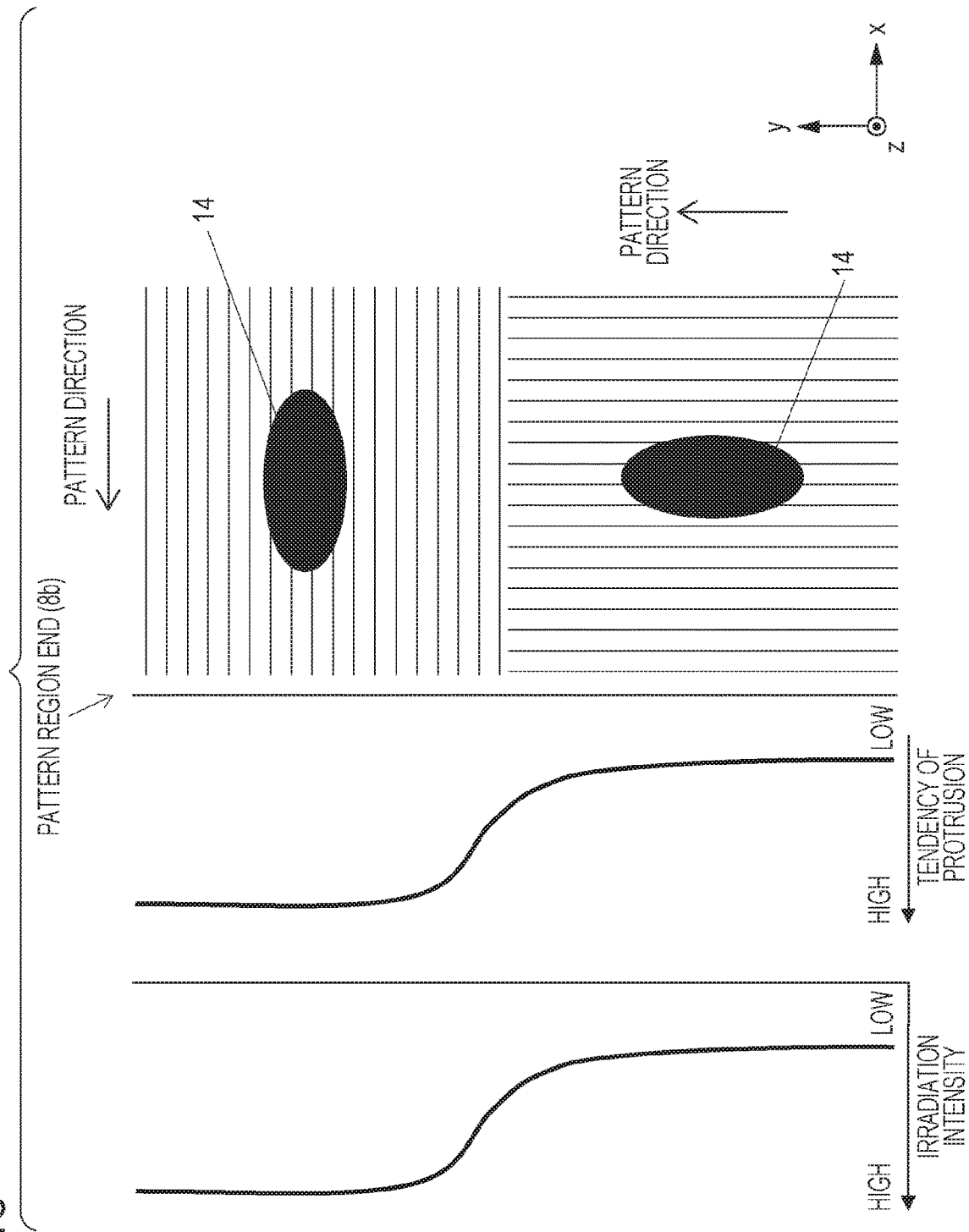

IMPRINT APPARATUSES AND ARTICLE MANUFACTURING METHODS APPLYING VISCOSITY INCREASES WITHOUT CURING OF IMPRINT MATERIAL

CROSS-REFERENCE TO RELATED APPLICATIONS

This application is a Continuation of International Patent Application No. PCT/JP2018/037705, filed Oct. 10, 2018, which claims the benefit of Japanese Patent Application No. 2017-204553, filed Oct. 23, 2017, Japanese Patent Application No. 2017-201415, filed Oct. 17, 2017, Japanese Patent Application No. 2018-177272, filed Sep. 21, 2018, and Japanese Patent Application No. 2018-177271, filed Sep. 21, 2018, all of which are hereby incorporated by reference herein in their entirety.

TECHNICAL FIELD

The present invention relates to an imprint apparatus forming a pattern of an imprint material on a substrate by using a mold.

BACKGROUND ART

An imprint method for shaping an imprint material on a substrate by using a mold is known as a method for manufacturing articles, such as semiconductor devices and MEMS. According to the imprint method, the imprint material is supplied onto the substrate, and the supplied imprint material is brought into contact with the mold (called "imprinting"). Then, the imprint material is cured in a contact state with the mold, and the mold is released from the cured imprint material (called "mold releasing"). As a result, a pattern of the imprint material is formed on the substrate.

In an imprint apparatus, after bringing the imprint material on the substrate and the mold into contact, the imprint material is fully filled into concave portions of a concave-convex pattern formed in the mold, and then the imprint material is cured. Japanese Patent Laid-Open No. 2013-069919 discloses an imprint apparatus in which light for curing the imprint material is applied to an outer peripheral portion of the substrate in order to prevent the imprint material from spreading to the outer peripheral portion of the substrate while the imprint material and the mold are held in contact with each other.

A partial region of the mold used in the imprint apparatus is in the form of a projection (called a "mesa portion") that is projected from a surrounding region. The mesa portion of the mold has a surface where a pattern (pattern region) to be formed on the substrate is formed, or a surface defined by a flat plane where no pattern is formed. Accordingly, there is a possibility that, during a period in which the imprint material on the substrate and the mesa portion of the mold are kept opposite to each other and the imprint material is held in contact with the surface of the mesa portion, the imprint material may protrude from the mesa portion and adhere to a lateral surface of the mesa portion, thereby causing foreign matters. The imprint apparatus disclosed in Japanese Patent Laid-Open No. 2013-069919 can prevent the imprint material from spreading to the outer peripheral portion of the substrate, but it cannot prevent the imprint material from protruding over a lateral surface (outer side) of the mesa portion of the mold.

SUMMARY OF INVENTION

The present invention provides an imprint apparatus forming a pattern of an imprint material on a substrate by using a mold, the imprint apparatus including an optical system applying, to a peripheral region, irradiation light acing to increase viscosity of the imprint material, the peripheral region including an end of a mesa portion of the mold and surrounding the mesa portion in a state in which the mesa portion of the mold is held in contact with the imprint material, and a control unit controlling the optical system such that timings of applying the irradiation light to a plurality of zones in the peripheral region are different from each other, the zones being positioned at different distances from a center of the mesa portion, in the state in which the mesa portion of the mold is held in contact with the imprint material on the substrate.

Further features of the present invention will become apparent from the following description of exemplary embodiments with reference to the attached drawings.

BRIEF DESCRIPTION OF DRAWINGS

FIG. 16 illustrates a distribution of irradiation intensity in a ninth embodiment.

DESCRIPTION OF EMBODIMENTS

Figure 1:
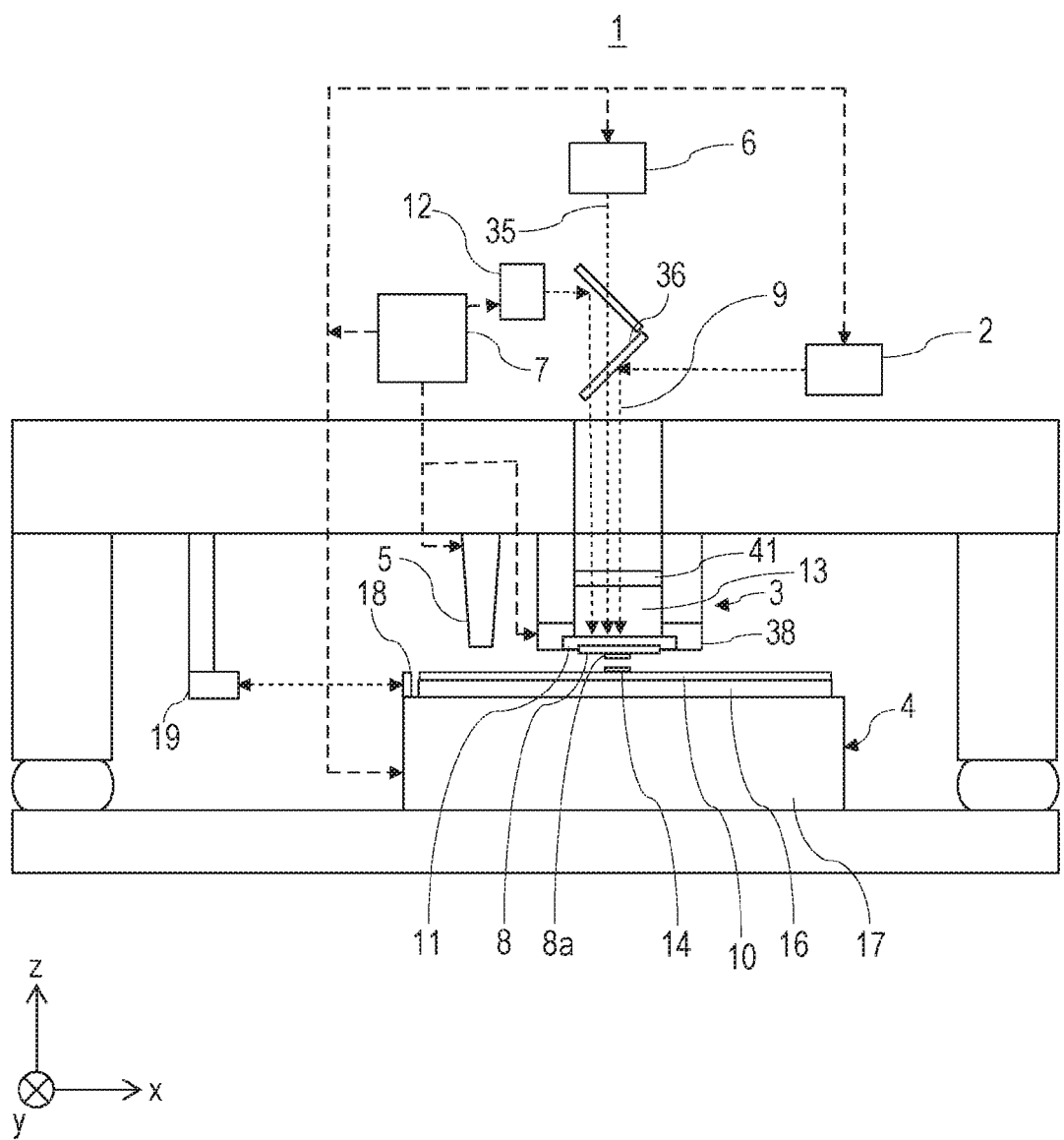
FIG. 1 illustrates an imprint apparatus.

Preferred embodiments of the present invention will be described in detail below with reference to the drawings. The same components in the drawings are denoted by the same reference signs and duplicate description of those components is omitted.

Imprint Apparatus

FIG. 1 illustrates a configuration of an imprint apparatus 1 according to an embodiment. The configuration of the imprint apparatus 1 is described with reference to FIG. 1. Here, axes are defined as illustrated in FIG. 1 on an assumption that a plane where a substrate 10 is disposed is an XY-plane and a direction orthogonal to the XY-plane is a Z direction. The imprint apparatus 1 is an apparatus in which an imprint material supplied onto a substrate is brought into contact with a mold 8 and energy for curing the imprint material is applied to form a pattern of the cured material through transfer of a concave-convex pattern of the mold. The mold may also be called a template or an original plate. The imprint apparatus 1 illustrated in FIG. 1 is used to manufacture a device, for example, a semiconductor device, as an example of an article. The imprint apparatus 1 using a light curing method is described here.

In the imprint apparatus, the imprint material supplied onto the substrate is brought into contact with the mold, and energy for curing the imprint material is applied to form the pattern of the cured material through transfer of the concave-convex pattern of the mold. In other words, the imprint apparatus is an apparatus for shaping the imprint material on the substrate by using the mold.

The imprint apparatus 1 includes a mold holder 3 (imprint head) for holding and moving the mold 8, a substrate holder 4 (stage) for holding and moving the substrate 10, and a supply unit 5 (dispenser) for supplying the imprint material onto the substrate. The imprint apparatus 1 further includes a light irradiation system 2 for emitting light 9 to cure the imprint material, an image capturing unit 6 for emitting light 35 and capturing a contact state between the mold and the imprint material, and a control unit 7 for controlling operation of the imprint apparatus 1. In addition, the imprint apparatus 1 includes a detector 12 for detecting marks formed on the mold and the substrate.

The substrate holder 4 includes a substrate chuck 16 for holding the substrate 10, and a substrate drive mechanism 17 for controlling a position of the substrate 10 with respect to at least two axes in the XYZ-coordinate system, namely in an X-axis direction and a Y-axis direction. A position of the substrate holder 4 is determined by a mirror 18 and an interferometer 19 that are disposed on the substrate holder 4. The position of the substrate holder 4 may be determined by using an encoder instead of both the mirror 18 and the interferometer 19.

The mold holder 3 is moved in an up-down direction (Z-axis direction) by a mold drive mechanism 38 (actuator), disposed on the mold holder, in a state in which the mold 8 is held by a mold chuck 11. When the mold holder 3 is moved downward (in a −Z direction) by the mold drive mechanism 38, a pattern region 8a of the mold 8 is brought into contact with the imprint material 14 (called "imprinting"). A mesa portion 8d (see FIG. 3) of the mold 8 used in the imprint apparatus 1 has a surface where a pattern (pattern region) reversal to a concave-convex pattern to be formed on the substrate is formed, or a surface defined by a flat plane (flat portion) where no pattern is formed. Although the following description is made in connection with the case in which the mesa portion of the mold has the pattern region 8a, the mesa portion of the mold may be the flat portion in which no pattern is formed. After the imprint material has been cured, the mold holder 3 is moved upward (in a +Z direction) by the mold drive mechanism 38, whereby the pattern region 8a of the mold 8 is released from the cured imprint material (called "mold releasing").

A space 13 defined by a partition plate 41 and the mold 8 may be formed in the mold holder 3 such that the mold 8 can be deformed during the imprinting and/or the mold-releasing by adjusting pressure in the space 13. For example, by increasing the pressure in the space 13 during the imprinting, the pattern region 8a and the imprint material 14 can contact with each other in a state in which the mold 8 is deformed into a shape projecting toward the substrate 10.

The detector 12 can detect the mark formed on the mold 8 and the mark formed on the substrate 10. The imprint apparatus 1 can detect a position of the mold 8 relative to the substrate 10 in accordance with a result detected by the detector 12, and can align the mold 8 and the substrate 10 by moving at least one of the mold 8 and the substrate 10.

The control unit 7 controls operations of various mechanisms in the imprint apparatus 1 to form a pattern in a plurality of shot regions that are formed on the substrate 10. Furthermore, the control unit 7 may be constituted to have the functions of controlling the mold holder 3, the substrate holder 4, the supply unit 5, the light irradiation system 2, and the detector 12. The control unit 7 may be disposed within the imprint apparatus 1, or may be installed at a place separate from the imprint apparatus 1 and may perform remote control.

The imprint material is given as a curable composition (also called a "resin in an uncured state") that is cured with application of curing energy. For example, an electromagnetic wave or heat is used as the curing energy. The electromagnetic wave is, for example, light having a wavelength selected from a range of 10 nm or longer to 1 mm or shorter, namely infrared light, visible light, or ultraviolet light.

The curable composition is a composition that is cured with irradiation of light or heating. Of those compositions, a photo-curable composition that is cured with irradiation of light contains at least a polymerizable compound and a photo-polymerization starter, and it may further contain a non-polymerizable compound or a solvent as required. The non-polymerizable compound is at least one selected from a group including a sensitizer, a hydrogen donor, an internal mold release agent, a surfactant, an antioxidant, a polymer component, and so on.

The imprint material is applied in the form of a film onto the substrate by using a spin coater or a slit coater. Alternatively, the imprint material may be applied in the form of a droplet or in an island- or film-like shape formed by a plurality of interconnected droplets onto the substrate by using a liquid-jet head. Viscosity (at 25° C.) of the imprint material is, for example, not less than 1 mPa·s and not more than 100 mPa·s.

The substrate is made of, for example, glass, ceramic, metal, semiconductor, or resin. A member made of a material different from that of the substrate may be formed on a surface of the substrate as required. A practical example of the substrate is a silicon wafer, a compound semiconductor wafer, a quartz glass sheet, or the like.

First Embodiment

Figure 2:
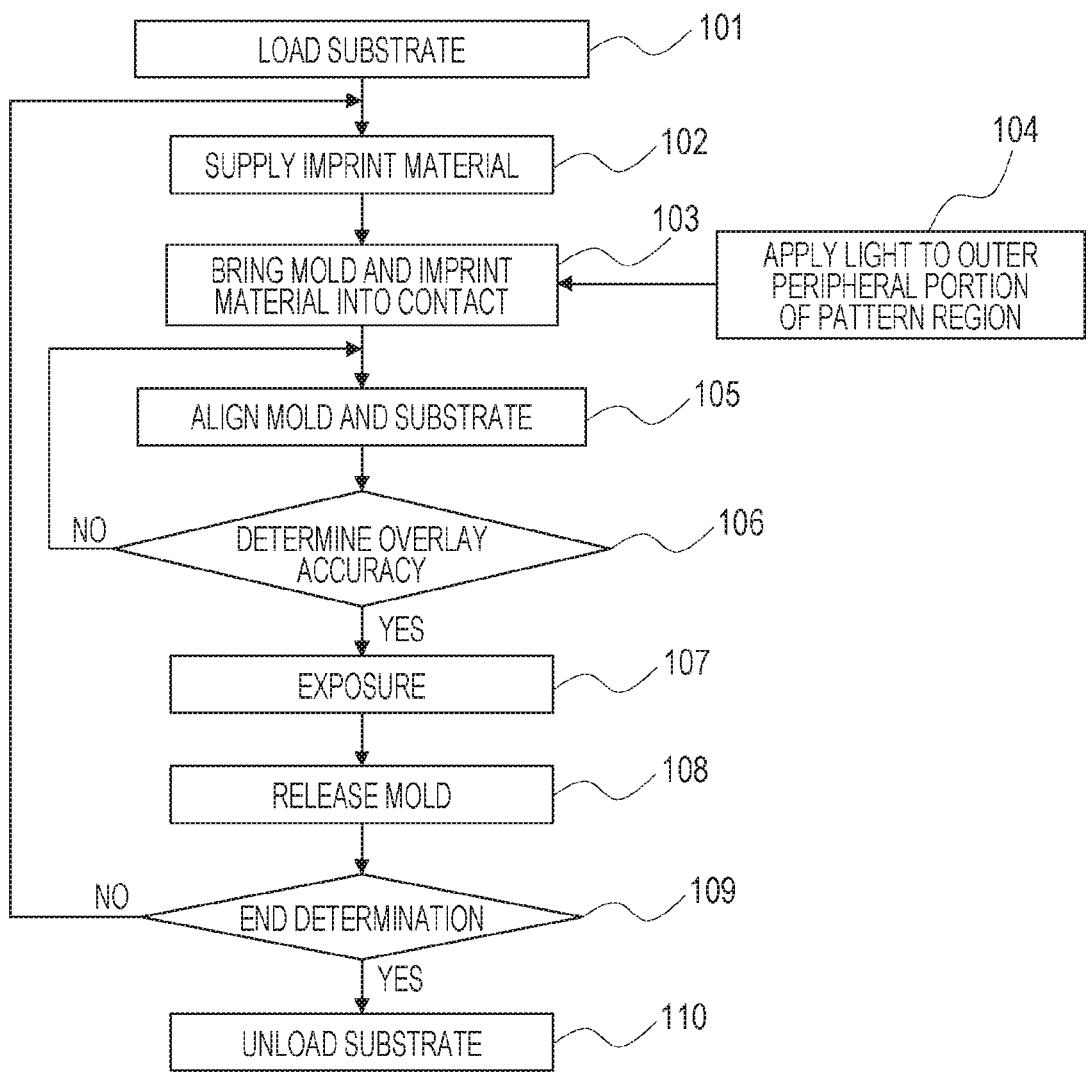
FIG. 2 illustrates steps of forming a pattern of an imprint material.

FIG. 2 is a flowchart illustrating steps of shaping the imprint material 14 on the substrate 10 by the imprint apparatus 1. An imprint method with the light curing method is described with reference to FIG. 2.

First, in step 101, the substrate 10 is loaded into the imprint apparatus 1. The substrate 10 is loaded to locate on the substrate chuck 16 of the substrate holder 4 by a substrate conveying mechanism (not illustrated).

Then, in step 102, the supply unit 5 supplies the imprint material 14 to the shot region on the substrate 10 where a pattern of the imprint material is to be formed. In step 103, the mold 8 and the substrate 10 are positioned close to each other such that the imprint material 14 supplied onto the substrate 10 and the pattern region 8a of the mold 8 are brought into contact (imprinting step).

Figure 3A:
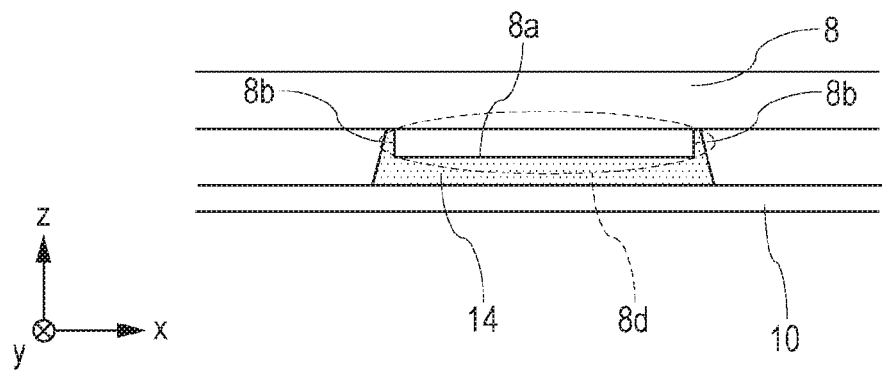
FIG. 3A illustrates an imprint method of related art.
Figure 3B:
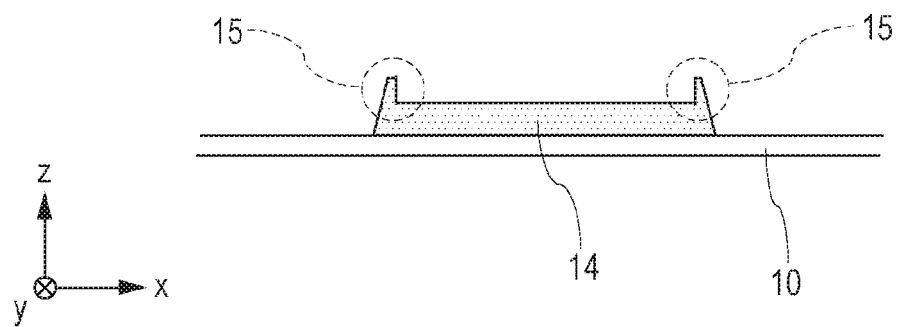
FIG. 3B illustrates the imprint method of the related art.

In this connection, as illustrated in FIG. 3A, it is found that, because of high wettability between the imprint material 14 and the mold 8, the imprint material 14 protrudes from the pattern region 8a of the mold 8 and adheres to a lateral surface 8b of the pattern region 8a. If the imprint material 14 is cured in a state of adhering to the lateral surface 8b of the pattern region 8a, the imprint material 14 having a shape illustrated in FIG. 3B is formed when the mold 8 is released. It is to be noted that, in FIG. 3B, a fine concave-convex pattern corresponding to the pattern region 8a is omitted. If a projection 15 is formed on the imprint material 14 as illustrated in FIG. 3B, there is a possibility that a film thickness may become uneven and, for example, the etching process in the succeeding step may be adversely affected. There is further a possibility that a part of the imprint material 14 adhering to the lateral surface 8b of the pattern region 8a may drop onto the substrate 10 during the imprinting and may become a foreign matter. The presence of the foreign matter on the substrate 10 may destroy the fine pattern formed in the pattern region 8a of the mold 8 when the mold 8 contacts with the foreign matter on the substrate during the imprinting step. Hence the presence of the foreign matter may cause a failure in formation of the pattern.

Figure 3C:
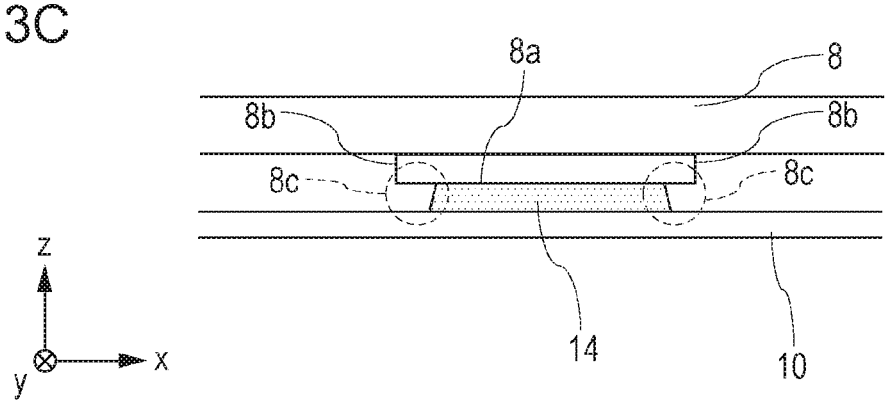
FIG. 3C illustrates the imprint method of the related art.

In a location where the imprint material is finally filled, such as a corner of the shot region (i.e., a corner of the shot region having a rectangular shape), an unfilled zone 8c may generate as illustrated in FIG. 3C because the imprint material 14 is not fully filled over the entire pattern region 8a. When the unfilled zone 8c is present on the substrate 10, there is also a possibility that the film thickness of the imprint material 14 may become uneven and, for example, the etching process in the succeeding step may be adversely affected. This embodiment is intended to provide an imprint apparatus with a high yield by reducing adhesion of the imprint material to the lateral surface 8b of the pattern region 8a and by preventing the failure in formation of the pattern and damage of the mold 8.

To that end, in the imprint apparatus 1 according to this embodiment, the protrusion of the imprint material 14 is prevented by applying irradiation light 50 to an outer peripheral portion of the pattern region 8a in step 104 when the pattern region 8a is brought into contact with the imprint material 14 in the step 103. In the step 104, the irradiation light 50 is applied in a state in which a part of the pattern region 8a is in contact with the imprint material 14 before completion of step 103.

After the imprinting has been completed and the imprint material has been filled into the pattern of the pattern region 8a in the step 103, alignment between the mold 8 and the substrate 10 is performed in step 105. The alignment between the mold 8 and the substrate 10 is performed, for example, by detecting lights reflected from the mark formed on the mold 8 and the mark formed on the substrate 10 by the detector 12. The irradiation light 50 is not applied to near a center of the pattern region 8a of the mold 8 where the fine pattern is formed. By applying the irradiation light 50 to the lateral surface 8b of the mold 8 as described above, it is possible to prevent the imprint material 14 from adhering to the lateral surface 8b and to maintain the filling-up performance to the fine pattern without changing the viscosity of the imprint material 14 that exists in a central area of the mold 8.

In the step 104, the viscosity of the imprint material 14 is changed, but the imprint material 14 is not yet cured. If the imprint material 14 near the lateral surface 8b of the mold 8 is cured as in the related art in order to prevent the imprint material 14 from adhering to the lateral surface 8b of the mold 8, a difficulty arises in performing the alignment between the mold 8 and the substrate 10. Moreover, when a fine structure is formed in the pattern region 8a up to a position near the lateral surface 8b of the mold 8, the imprint material 14 is cured before it is fully filled into the fine structure, and defects due to insufficient filling-up of the imprint material increase. A decrease of overlay accuracy and an increase of defects due to the insufficient filling-up may reduce the yield.

If, as a result of determining the overlay accuracy, the overlay accuracy satisfies a determination value in step 106, the imprint material 14 is cured in step 107 in the state in which the mold 8 and the imprint material 14 are in contact with each other. After curing the imprint material 14, the mold 8 is released from the cured imprint material 14 in step 108 (mold releasing). If the overlay accuracy does not satisfy the determination value in the step 106, the step of aligning the mold and the substrate, i.e., the step 105, is continued. Alternatively, if the determination value is not satisfied in the step 106, the process may be forcibly advanced to a next step.

After the mold 8 has been released from the imprint material 14 on the substrate in the step 108, end determination as to whether the imprint process has completed on the designated shot region on the substrate 10 is performed in step 109. If it is determined in the step 109 that the imprint process has completed, the substrate 10 is unloaded to the outside of the imprint apparatus 1 in step 110. If the imprint process has not yet completed, the procedure is returned to the step 102 and the imprint material 14 is supplied to a next imprint position (shot region). In this way, the individual steps are repeated until the imprint process is completed.

Figure 4A:
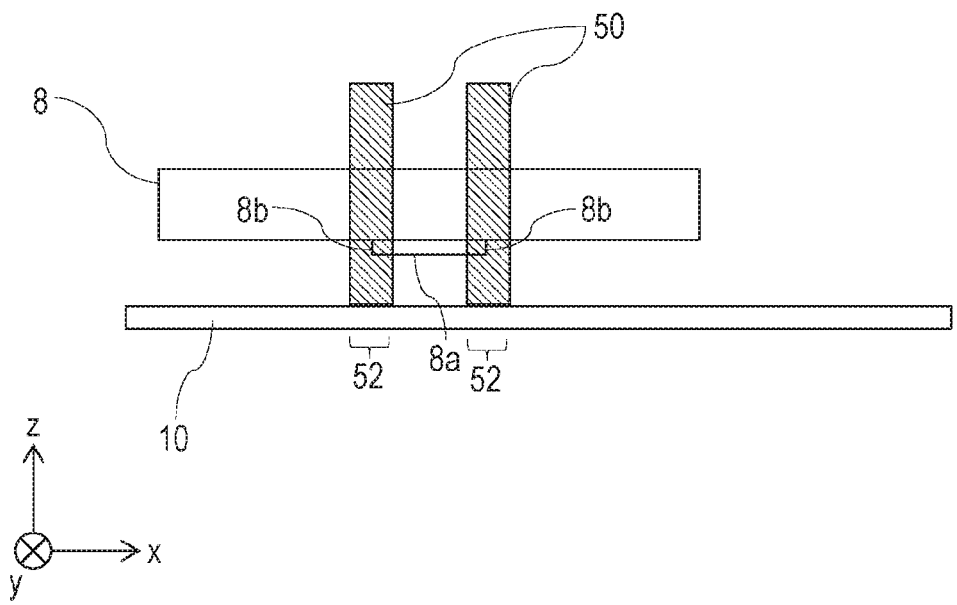
FIG. 4A illustrates an irradiation region in a first embodiment.

The light irradiation performed in the step 104 is described in detail below. FIG. 4 is an explanatory view referenced to explain the light irradiation performed in the step 104. As illustrated in FIG. 4A, the irradiation light 50 is applied to a peripheral region (irradiation region 52) including the lateral surface 8b that is the outer peripheral portion of the pattern region 8a of the mold 8. The irradiation light 50 is just required to be light capable of causing a polymerization reaction of the imprint material 14, and is not limited to ultraviolet light. If the imprint material 14 is cured by the irradiation light 50, the alignment cannot be performed in the step 105. Accordingly, the light irradiation in the step 104 is performed by applying the light to such an extent as increasing the viscosity of the imprint material 14 near the pattern region 8a without curing the imprint material 14. The wavelength, the irradiation time, the intensity and so on of the irradiation light 50 can be determined as appropriate in consideration of the material properties of the imprint material 14 and so on.

Figure 4B:
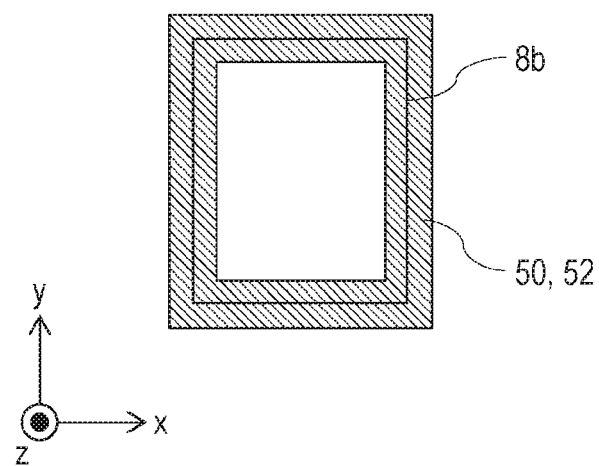
FIG. 4B illustrates the irradiation region in the first embodiment.

FIG. 4B illustrates a positional relation between the irradiation region 52 where the irradiation light 50 is applied to the substrate 10 through the mold 8 and the lateral surface 8b (outer peripheral portion) of the mold 8. As illustrated in FIG. 4, the irradiation region 52 of the irradiation light 50 includes the lateral surface 8b of the mold 8. By setting the irradiation region 52 as illustrated in FIG. 4, the imprint material 14 can be prevented from protruding from the pattern region 8a.

Figure 5A:
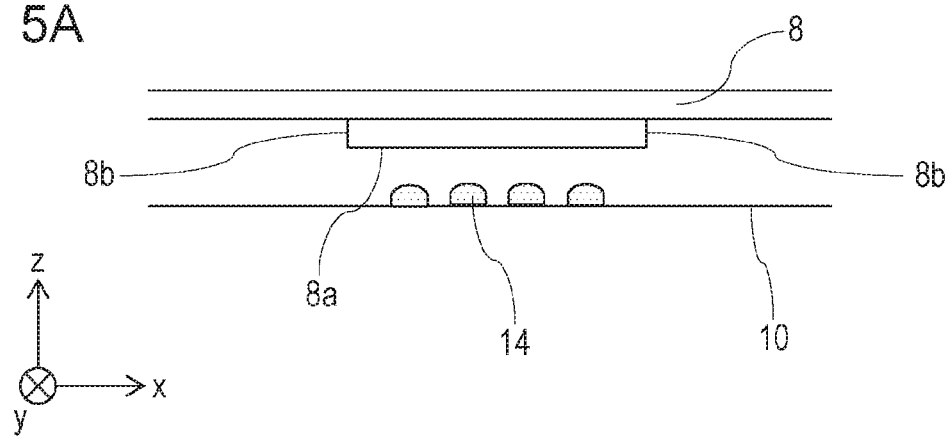
FIG. 5A illustrates an irradiation region in the first embodiment.
Figure 5B:
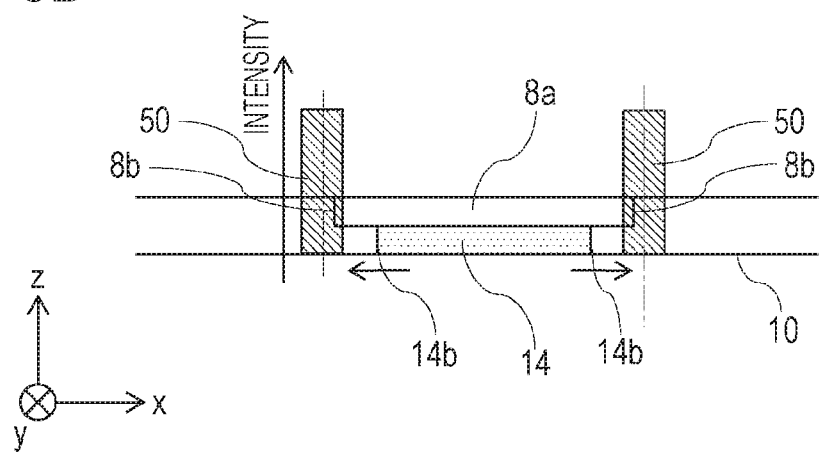
FIG. 5B illustrates the irradiation region in the first embodiment.
Figure 5C:
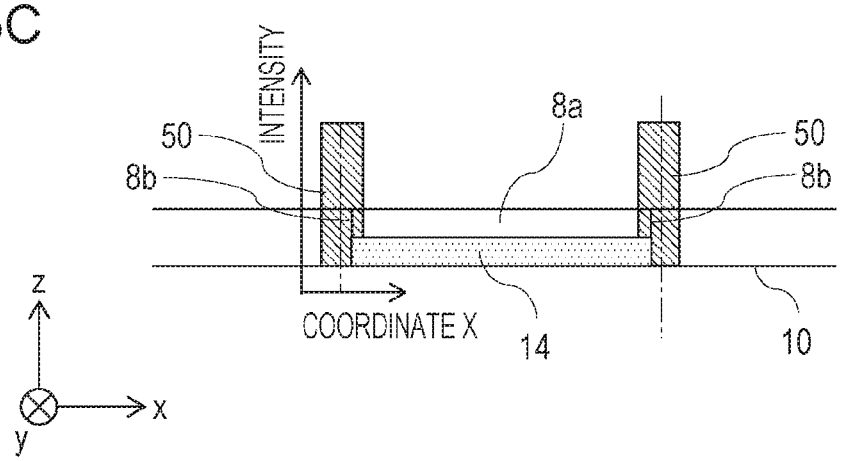
FIG. 5C illustrates the irradiation region in the first embodiment.

When the pattern region 8a of the mold 8 and the imprint material 14 supplied onto the substrate 10, both illustrated in FIG. 5A, are brought into contact, the pattern region 8a of the mold 8 is forced to deform into a shape projecting toward the substrate 10 and to contact with the imprint material 14 in some cases. As illustrated in FIG. 5B, a region where the mold and the imprint material are in contact with each other starts to spread toward the outer side (outer peripheral portion) of the pattern region 8a after the pattern region 8a near the center of the mold 8 and the imprint material 14 have come into contact. As illustrated in FIG. 5C, at a gas-liquid interface 14b of the imprint material 14 in the region irradiated with the irradiation light 50, the polymerization reaction is started by the irradiation light 50 and the viscosity of the imprint material 14 increases. With the increase in the viscosity of the imprint material 14 in the outer peripheral portion of the pattern region 8a, a moving speed of the gas-liquid interface 14b of the imprint material 14 spreading outward of the pattern region 8a is reduced and the imprint material can be prevented from adhering to the lateral surface 8b of the mold 8. In this connection, because the intensity of the irradiation light 50 and the irradiation timing of the irradiation light 50, which are necessary to properly change the viscosity of the imprint material 14, are different depending on the type of the imprint material 14, for example, irradiation conditions need to be separately sought based on experiments.

Figure 6:
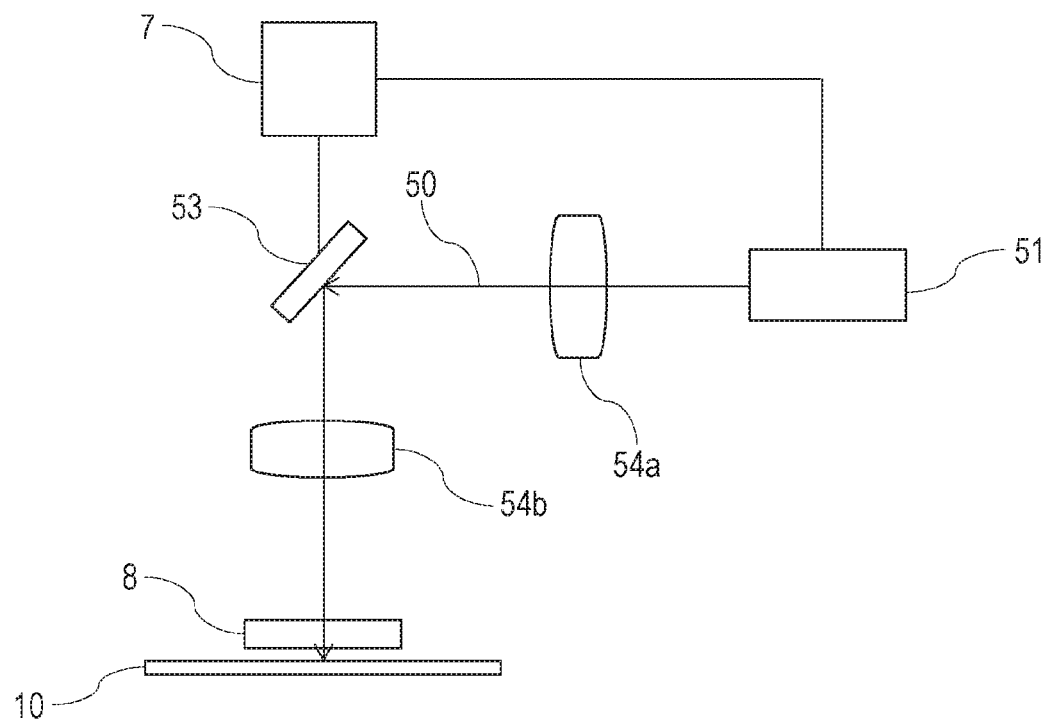
FIG. 6 illustrates an optical system that determines the irradiation region in the first embodiment.

An example of an optical system for applying the irradiation light 50 to the outer peripheral portion of the pattern region 8a (i.e., the region including the lateral surface 8b) is described with reference to FIG. 6. FIG. 6 is a schematic view of the optical system for applying the irradiation light 50. An irradiation light source 51 emitting light of a wavelength at which the imprint material 14 starts the polymerization reaction is prepared. The irradiation light source 51 is selected as a light source with an optical output capable of causing the imprint material 14 to develop the polymerization reaction and to have the desired viscosity. The irradiation light source 51 is constituted by, for example, a lamp, a laser diode, or an LED. Light from the irradiation light source 51 is introduced to a light modulator 53 (spatial light modulator) through an optical element 54a. As an example, a digital micromirror device (hereinafter called a "DMD") is used as the light modulator 53 in this embodiment. However, the light modulator 53 is not limited to the DMD, and another type of light modulator, such as an LCD device or an LCOS device, can also be used. With the light modulator 53 disposed between the irradiation light source 51 and the substrate 10, the imprint apparatus 1 can optionally set the irradiation region 52 and the intensity of the irradiation light 50 at any location on the substrate. Furthermore, after control of the irradiation region 52 and the light intensity has been made on the irradiation light 50 by the light modulator 53, a magnification of the irradiation light 50 projected to the mold 8 and the substrate 10 is adjusted by an optical element 54b.

The above-described steps 103 and 104 in the first embodiment will be described in more detail below.

Figure 7:
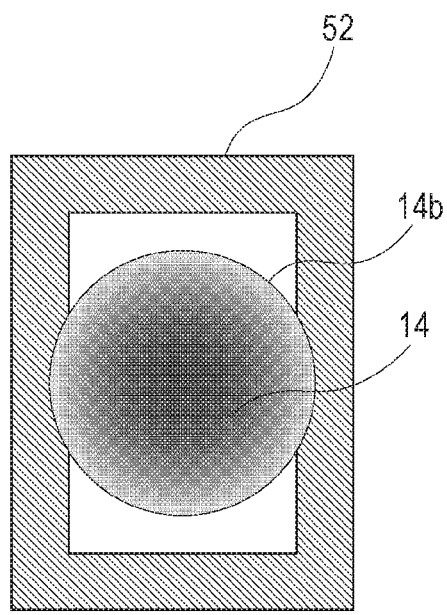
FIG. 7 illustrates a region where the imprint material and the mold are in contact with each other and the irradiation region.

When the mold 8 is brought into contact with the imprint material 14 in the step 103, the gas-liquid interface 14b of the imprint material 14 spreads outward in a circular or similar shape as illustrated in FIG. 7. In other words, a contact region between the mold 8 and the imprint material 14 changes in a way of spreading from near the center of the pattern region 8a. Because the pattern region 8a of the mold 8 generally rectangular, the irradiation region 52 also has a shape similar to the rectangular outer peripheral portion of the pattern region 8a. Therefore, timings at which the gas-liquid interface 14b of the imprint material 14 reaches the irradiation region 52 of the irradiation light 50 (i.e., the outer peripheral portion of the pattern region 8a) are different depending on various positions of the irradiation region 52.

On the other hand, if the irradiation timing of the irradiation light 50 is earlier than the timing at which the gas-liquid interface 14b reaches the irradiation region 52 in the step 104, there is a possibility that the defects due to the insufficient filling-up may generate in the pattern region 8a at positions near the lateral surface 8b of the mold 8. Furthermore, if the irradiation timing of the irradiation light 50 is later than the timing at which the gas-liquid interface 14b reaches the irradiation region 52, there is a possibility that the imprint material 14 may protrude toward the lateral surface 8b of the mold 8 and adhere thereto. Accordingly, the irradiation light 50 acting to prevent the protrusion of the imprint material 14 has to be applied at an appropriate timing in the imprinting step.

Figure 8A:
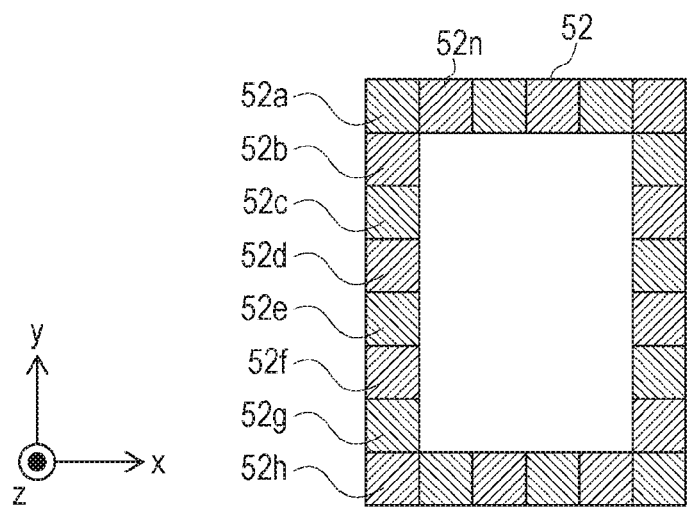
FIG. 8A illustrates individual irradiation zones and irradiation timings in the first embodiment.

Taking into account the above-mentioned point, in the first embodiment, the irradiation region 52 is divided into a plurality of small zones 52a, 52b, ..., 52n in the step 104, as illustrated in FIG. 8A. In addition, the irradiation light 50 is applied to the small zones while at least one of the irradiation timing and the irradiation intensity is changed for each of the small zones. With respect to the irradiation region 52, the irradiation timing, the irradiation zone, and the irradiation intensity of the irradiation light 50 can be set by using the light modulator 53. Although FIG. 8A illustrates an example in which the irradiation region 52 is divided into square small zones consisting of eight zones in a vertical direction and six zones in a horizontal direction, the number of the divided small zones is not limited to such an example and it may be set to a desired value. Moreover, the shape of each small zone may be set to any other suitable shape such as a rectangular or triangular shape.

In the first embodiment, timings at which the gas-liquid interface 14b reaches the small zones 52a, 52b, ..., 52n in the irradiation region 52 are determined, and the irradiation timing of the irradiation light 50 to each small zone is changed in accordance with a determination result. The timing at which the gas-liquid interface 14b reaches each small zone can be determined in real time on the basis of a result captured by the image capturing unit 6. Alternatively, the timing at which the gas-liquid interface 14b reaches each small zone may be determined in advance, and the irradiation timing of the irradiation light 50 to each small zone may be determined on the basis of such a result.

Figure 8B:
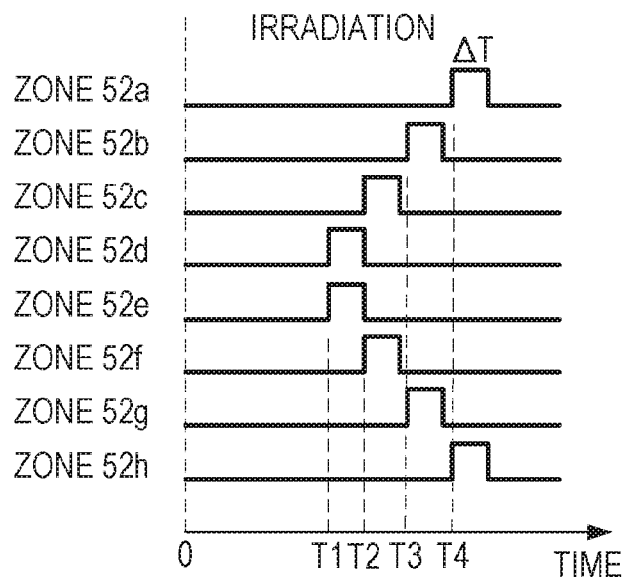
FIG. 8B illustrates the individual irradiation zones and the irradiation timings in the first embodiment.

FIG. 8B is a chart representing the irradiation timing of the irradiation light 50 for each of the small zones in the irradiation region 52 when the gas-liquid interface 14b spreads outward from the center of the pattern region 8a as illustrated in FIG. 7. For simplification of the description, FIG. 8B illustrates the irradiation timing charts for only the small zones 52a, 52b, ..., 52h in the irradiation region 52 along a left side of the pattern region 8a. The horizontal axis indicates time. As seen from FIG. 8B, the irradiation timing is earlier for the small zone at which the gas-liquid interface 14b arrives earlier after the start of the imprinting step.

The gas-liquid interface 14b spreading from near the center of the pattern region 8a after the start of the imprinting step reaches the small zone 52d and the small zone 52e at a time T1. At this time, the control unit 7 in FIG. 6 controls the light modulator 53 such that the irradiation light 50 is applied to the small zone 52d and the small zone 52e. Then, the gas-liquid interface 14b reaches the small zone 52c and the small zone 52f at a time T2. At this time, the control unit 7 controls the light modulator 53 such that the irradiation light 50 is applied to the small zone 52c and the small zone 52f. Then, the gas-liquid interface 14b reaches the small zone 52b and the small zone 52g at a time T3. At this time, the control unit 7 controls the light modulator 53 such that the irradiation light 50 is applied to the small zone 52b and the small zone 52g. Finally, the gas-liquid interface 14b reaches the small zone 52a and the small zone 52h at a time T4. At this time, the control unit 7 controls the light modulator 53 such that the irradiation light 50 is applied to the small zone 52a and the small zone 52h.

A time period during which the irradiation light 50 is applied to each small zone can be set optionally. In the example illustrated in FIG. 8B, the time period during which the irradiation light 50 is applied to each small zone is set to ΔT. The intensity of the irradiation light applied to each small zone is set to be the same.

Figure 9A:
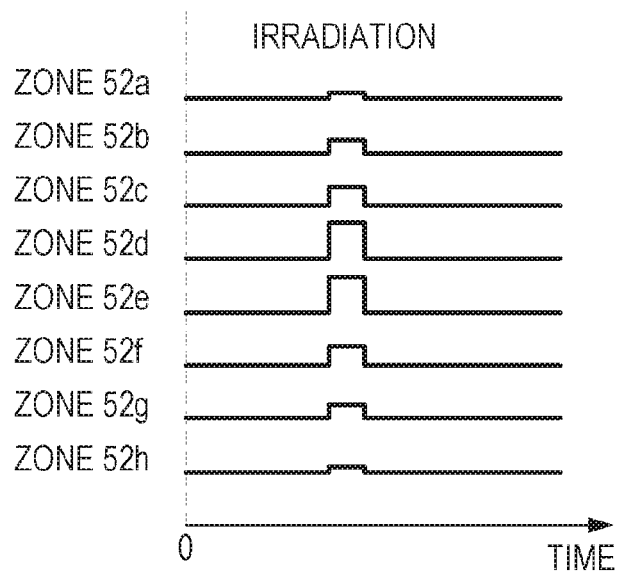
FIG. 9A illustrates irradiation intensities and an irradiation time in a second embodiment.

The irradiation intensity may be changed instead of the irradiation timing of the irradiation light 50. For example, the irradiation intensity for the small zones 52a, 52b, ..., 52h in the irradiation region 52 may be changed as illustrated in FIG. 9A. The horizontal axis indicates time, and the vertical axis indicates the irradiation intensity for each small zone. The irradiation intensity of the irradiation light 50 for the small zone at which the gas-liquid interface 14b first arrives is set to a high level, and the irradiation intensity is gradually reduced in the order the gas-liquid interface 14b reaches the small zones. In FIG. 9A, the horizontal axis indicates time, and the vertical axis indicates the irradiation intensity of the irradiation light 50 for each of the small zones (i.e., the small zone 52a through the small zone 52h).

Figure 8C:
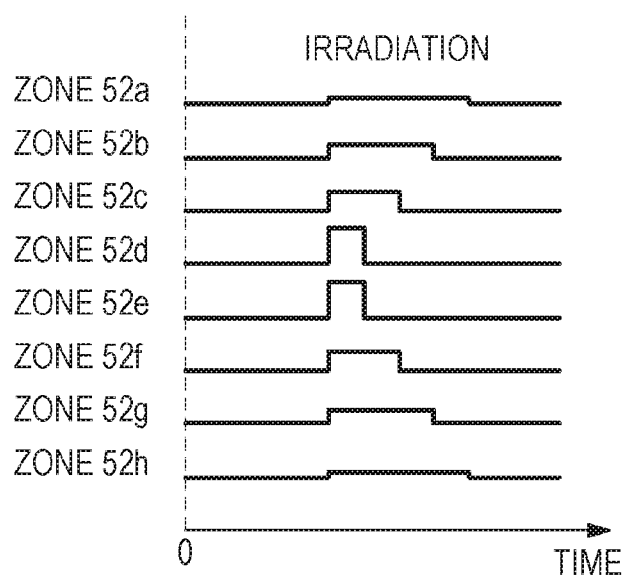
FIG. 8C illustrates the individual irradiation zones and the irradiation timings in the first embodiment.

Although the above description referring to FIG. 8 has been made on only the small zones in the irradiation region 52 along the left side of the pattern region 8a, the irradiation timing or the irradiation intensity is actually determined for each of all the small zones 52a, 52b, ..., 52n. By dividing the irradiation region as described above, the irradiation light 50 can be applied at the optimum timings in accordance with the spreading of the contact region between the pattern region 8a of the mold and the imprint material 14 on the substrate.

Second Embodiment

A second embodiment is described in connection with the case of changing an irradiation amount of the irradiation light 50 applied to the small zones (i.e., the small zone 52a through the small zone 52n) in the irradiation region 52 described in the first embodiment.

Speeds, i.e., energy amounts, of the gas-liquid interface 14b when passing the small zones 52a, 52b, ..., 52n in the irradiation region 52, described in the first embodiment, are different from one another. Taking into account that point, in the second embodiment, the irradiation light 50 is applied while the irradiation amount of the irradiation light 50 is changed for each small zone, in order to more accurately control the viscosity at the spreading gas-liquid interface 14b.

Figure 9B:
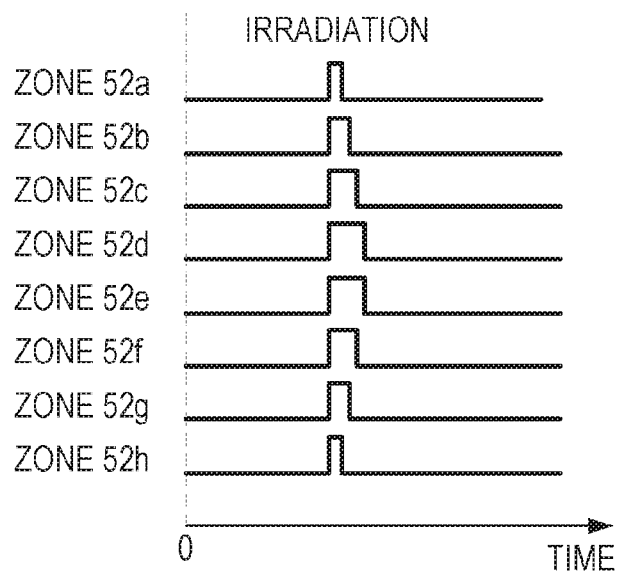
FIG. 9B illustrates irradiation intensity and irradiation times in the second embodiment.

FIGS. 9A and 9B are charts representing the irradiation timings of the irradiation light 50 to the small zones in the irradiation region 52 when the gas-liquid interface 14b spreads outward from the center of the pattern region 8a as illustrated in FIG. 7. For simplification of the description, FIGS. 9A and 9B illustrate the irradiation timing charts for only the small zones 52a, 52b, ..., 52h in the irradiation region 52 along the left side of the pattern region 8a. The horizontal axis indicates time, and the vertical axis indicates the irradiation intensity for each small zone. FIG. 9A represents an example in which the irradiation time is held constant and the irradiation intensity is changed. FIG. 9B represents an example in which the irradiation intensity is held constant and the irradiation time is changed. As seen from FIG. 9, the irradiation amount is increased for the small zone at which the gas-liquid interface 14b arrives earlier after the start of the imprinting step.

When the gas-liquid interface 14b spreads outward from the center of the pattern region 8a as illustrated in FIG. 7, an exposure amount is generally set to provide a larger exposure amount for the small zones 52d and 52e near the center and a smaller exposure amount for the small zones 52a and 52h in the end portion. In addition to changing the exposure amounts for the small zones, the irradiation timings for the small zones may also be changed as described in the first embodiment.

Although the above description referring to FIG. 9 has been made on only the small zones in the irradiation region 52 along the left side of the pattern region 8a, the irradiation amount is actually determined for each of all the small zones 52a, 52b, . . . , 52n. By dividing the irradiation region 52 as described above, the irradiation light 50 can be applied in the optimum exposure amounts in accordance with the spreading of the contact region between the pattern region 8a of the mold and the imprint material 14 on the substrate.

Third Embodiment

A third embodiment is described in connection with the case of changing the irradiation timings of the irradiation light 50 to the small zones (i.e., the small zone 52a through the small zone 52n) in the irradiation region 52, described in the first embodiment, in accordance with distances between the small zones and a center position 61 of the shot region.

Figure 10A:
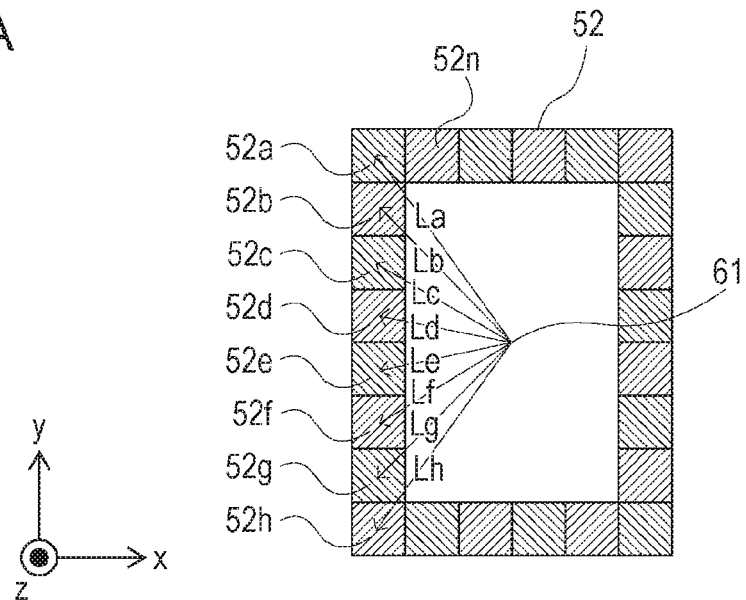
FIG. 10A illustrates individual irradiation zones and irradiation timings in a third embodiment.
Figure 10B:
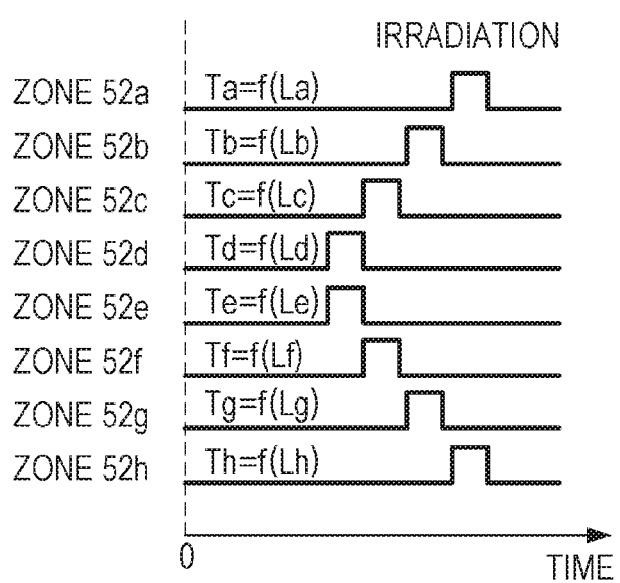
FIG. 10B illustrates the individual irradiation zones and the irradiation timings in the third embodiment.

FIG. 10B is a chart representing the irradiation timing of the irradiation light 50 for each of the small zones in the irradiation region 52 when the gas-liquid interface 14b spreads outward from the center of the pattern region 8a as illustrated in FIG. 7. For simplification of the description, FIG. 10B illustrates the irradiation timing charts for only the small zones 52a, 52b, . . . , 52h in the irradiation region 52 along the left side of the pattern region 8a. The horizontal axis indicates time. It is here assumed that the distances between the center position 61 of the shot region and the small zones 52a, 52b, . . . , 52h are denoted by La, Lb, . . . , Lh, respectively.

In the third embodiment, a start time of the imprinting step is set to 0 and the irradiation timing for each small zone is defined by a function $Tx=f(Lx)$ where $x=a, b, \ldots, h$. In other words, the irradiation timing for each small zone in the third embodiment is determined in accordance with the distance. By using a proportional constant K, for example, the irradiation timing can be determined based on $Tx=K \times Lx$. The irradiation timing may be determined based on a linear function or a secondary or higher-order function. As seen from FIG. 10B, the irradiation timing is generally set to be earlier after the start of the imprinting step as the distance between the center position 61 of the shot region and each small zone in the irradiation region 52 is shorter. Although the timing charts of FIG. 10B have been described on the assumption that the start time of the imprinting step is 0, the timing at which the mold 8 and the imprint material 14 come into contact with each other may be set to the time 0.

Furthermore, the irradiation intensity or the irradiation time may be changed in accordance with the distances La, Lb, . . . , Lh in a similar manner to that described in the second embodiment. For example, when the irradiation intensity is changed in accordance with the distance, the irradiation intensity may be increased as the distance shortens. When the irradiation time is changed in accordance with the distance, the irradiation time may be prolonged as the distance shortens. Thus the irradiation amount may be changed in a similar manner to that described in the second embodiment. Alternatively, the irradiation timing and either one of the irradiation intensity and the irradiation amount may be changed.

Although the above description referring to FIG. 10 has been made on only the small zones in the irradiation region 52 along the left side of the pattern region 8a, the irradiation timing or the irradiation amount is actually determined for each of all the small zones 52a, 52b, . . . , 52n in accordance with the distance from the center position 61. The number of the divided small zones 52a, 52b, . . . , 52n in the irradiation region 52 and the shape of each divided small zone are not limited to those illustrated in FIG. 10A as in the above-described case. By dividing the irradiation region 52 as described above, the irradiation light 50 can be applied in the optimum exposure amount in accordance with the distance between the center of the shot region and each small zone. According to the third embodiment, even when there is no result captured by the image capturing unit 6, the irradiation timing can be controlled in accordance with the shape of the shot region.

Fourth Embodiment

A fourth embodiment is described in connection with the case of changing the irradiation timings of the irradiation light 50 to the small zones (i.e., the small zone 52a through the small zone 52n) in the irradiation region 52, described in the first embodiment, in accordance with distances between the small zones and an imprint center position 62 of the mold 8. The irradiation intensity may be changed instead of the irradiation timing. Here, the imprint center position 62 of the mold 8 refers to a position at which the pattern region 8a of the mold 8 and the imprint material on the substrate first come into contact. In general, the center of the pattern region 8a of the mold 8 first contacts with the imprint material. However, when a pattern is formed in a shot region (also called a peripheral shot or an edge shot) including an outer periphery of substrate, the first contact position is not always the center of the pattern region 8a.

Figure 11A:
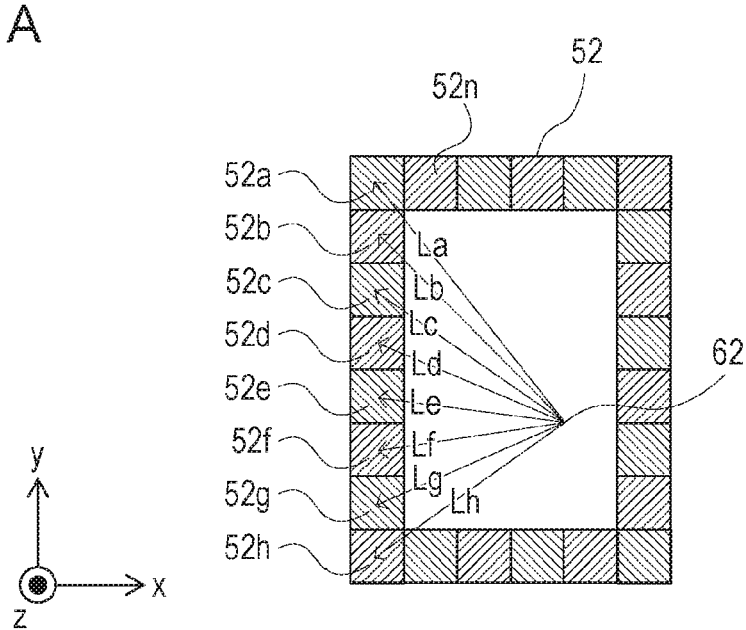
FIG. 11A illustrates individual irradiation zones and irradiation timings in a fourth embodiment.
Figure 11B:
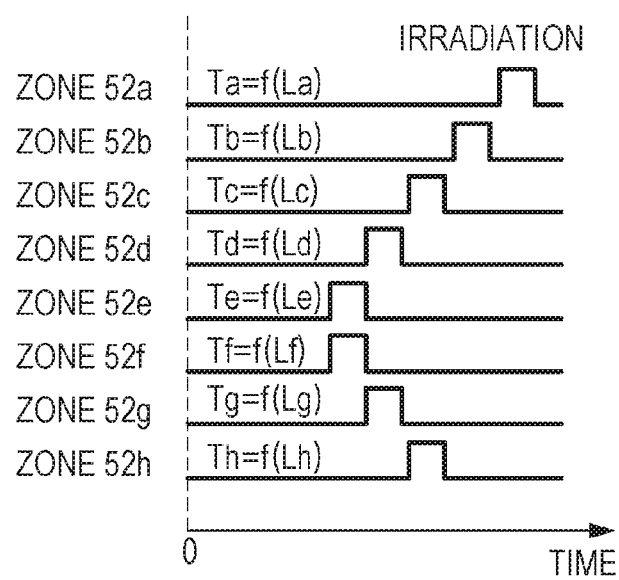
FIG. 11B illustrates the individual irradiation zones and the irradiation timings in the fourth embodiment.

FIG. 11A illustrates the irradiation region 52 and the imprint center position 62 of the mold 8 in the fourth embodiment. FIG. 11B represents the irradiation timings of the irradiation light for the small zones in the irradiation region 52 in such a case. For simplification of the description, FIG. 11B illustrates irradiation timing charts for only the small zones 52a, 52b, . . . , 52h in the irradiation region 52 along the left side of the pattern region 8a. The horizontal axis indicates time. It is here assumed that the distances between the imprint center position 62 and the small zones 52a, 52b, . . . , 52h are denoted by La, Lb, . . . , Lh, respectively.

In the fourth embodiment, the start time of the imprinting step is set to 0 and the irradiation timing for each small zone is defined by a function $Tx=f(Lx)$ where $x=a, b, \ldots, h$. In other words, the irradiation timing for each small zone in the fourth embodiment is determined in accordance with the distance as in the third embodiment. As seen from FIG. 11B, the irradiation timing is generally set to be earlier after the start of the imprinting step as the distance between the imprint center position 62 and each small zone in the irradiation region 52 is shorter. Although the timing charts of FIG. 11B have been described on the assumption that the start time of the imprinting step is 0, the timing at which the mold 8 and the imprint material 14 come into contact with each other may be set to the time 0.

Furthermore, the irradiation intensity or the irradiation time may be changed in accordance with the distances La, Lb, . . . , Lh in a similar manner to that described in the second embodiment. For example, when the irradiation intensity is changed in accordance with the distance, the irradiation intensity may be increased as the distance shortens. When the irradiation time is changed in accordance with the distance, the irradiation time may be prolonged as the distance shortens. Thus the irradiation amount may be changed in a similar manner to that described in the second embodiment. Alternatively, the irradiation timing and either one of the irradiation intensity and the irradiation amount may be changed.

Although the above description referring to FIG. 11 has been made on only the small zones in the irradiation region 52 along the left side of the pattern region 8a, the irradiation timing or the irradiation amount is actually determined for each of all the small zones 52a, 52b, . . . , 52n in accordance with the distance from the imprint center position 62. The number of the divided small zones 52a, 52b, . . . , 52n in the irradiation region 52 and the shape of each divided small zone are not limited to those illustrated in FIG. 11A as in the above-described case. When a pattern is formed in a shot region including an outer periphery of the substrate, there is no possibility that the imprint material comes into contact with the lateral surface 8b of the mold 8 because the imprint material does not contact with the pattern region 8a corresponding to an outside region of the substrate 10. Accordingly, the irradiation light 50 needs not to be applied to the small zones in the irradiation region 52, which are present in the outside region of the substrate 10.

By dividing the irradiation region 52 as described above, the irradiation light 50 can be applied in the optimum exposure amount in accordance with the distance between the imprint center position and each small zone. According to the fourth embodiment, even when there is no result captured by the image capturing unit 6, the irradiation timing can be controlled in accordance with the shape of the shot region.

Fifth Embodiment

Figure 12A:
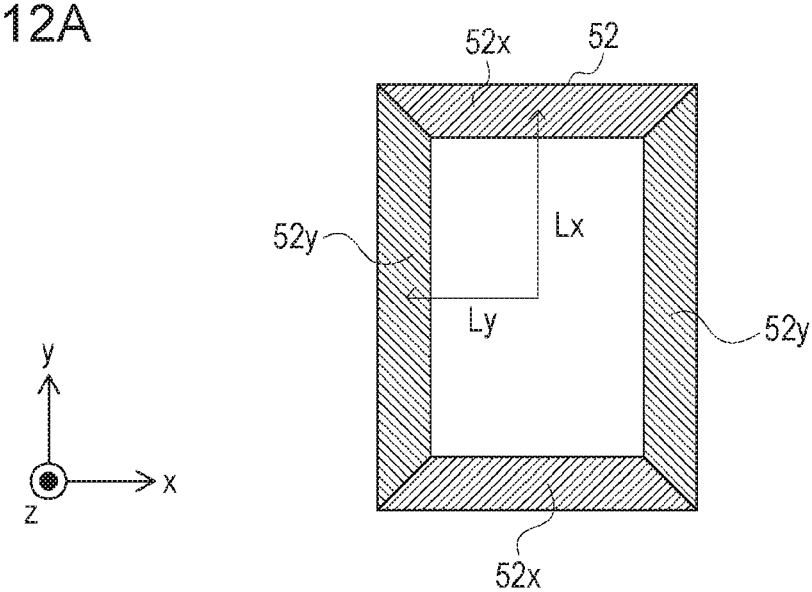
FIG. 12A illustrates individual irradiation zones and irradiation timings in a fifth embodiment.

A fifth embodiment is described in connection with the case in which small zones in the irradiation region 52 have different shapes from those of the small zones in the irradiation region 52 described in the above embodiments. In the fifth embodiment, as illustrated in FIG. 12A, the irradiation region 52 is divided into a small zone 52y lying long in the vertical direction (y direction), and a small zone 52x lying long in the horizontal direction (x direction). The irradiation light 50 is applied to each of those small zones while the irradiation timing or the irradiation intensity is changed.

Figure 12B:
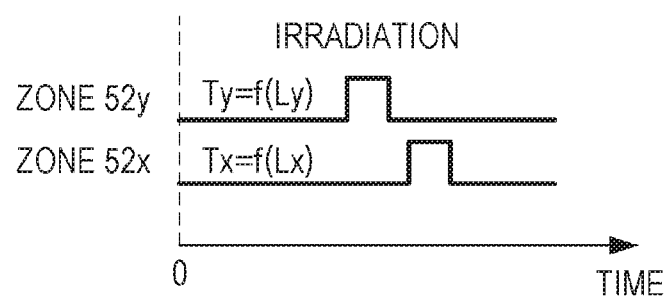
FIG. 12B illustrates the individual irradiation zones and the irradiation timings in the fifth embodiment.

FIG. 12A illustrates the irradiation region 52 in the fifth embodiment. Irradiation timings of the irradiation light 50 for the small zones 52x and 52y in the irradiation region 52 in this case are represented in FIG. 12B. In other words, FIG. 12B illustrates irradiation timing charts for the small zones 52x and 52y. The horizontal axis indicates time. It is here assumed that distances between the center position of the shot region or the imprint center position and the small zones 52x and 52y are denoted by Ly and Lx, respectively. In the case of the distance Ly<Lx as illustrated in FIG. 12A, the irradiation timing for the small zone 52y is generally earlier than that for the small zone 52x.

In the fifth embodiment, the irradiation light 50 can be applied to each of the vertically long small zone 52y and the horizontally long small zone 52x at the timing that is previously determined by experiments, for example. It is also possible to observe, by using the image capturing unit 6 such as a camera, the timing at which the gas-liquid interface 14b described in the above embodiments reaches each of the vertically long small zone 52y and the horizontally long small zone 52x, and to determine the irradiation timing of the irradiation light 50 on the basis of a result of the observation. As an alternative, the irradiation timing of the irradiation light 50 may be determined by the method of determining the irradiation timing, described in the third embodiment, in accordance with the distances Ly and Lx from the center position of the shot region or the imprint center position.

Furthermore, the irradiation intensity or the irradiation time may be changed in accordance with the distances Lx and Ly in a similar manner to that described in the second embodiment. For example, when the irradiation intensity is changed in accordance with the distance, the irradiation intensity may be increased as the distance shortens. When the irradiation time is changed in accordance with the distance, the irradiation time may be prolonged as the distance shortens. Thus the irradiation amount may be changed in a similar manner to that described in the second embodiment. Alternatively, the irradiation timing and either one of the irradiation intensity and the irradiation amount may be changed.

Figure 12C:
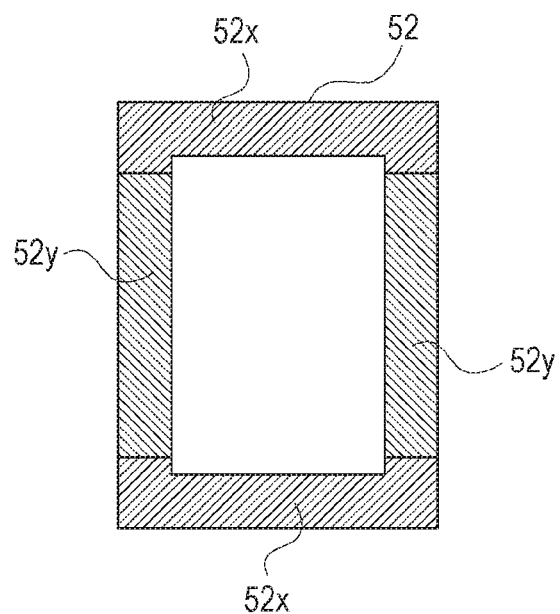
FIG. 12C illustrates individual irradiation zones and irradiation timings in the fifth embodiment.

A division method of defining the irradiation region into the vertically long small zone 52y and the horizontally long small zone 52x is not limited to the method illustrated in FIG. 12A. In another example, the irradiation region may be divided into the vertically long small zone 52y and the horizontally long small zone 52x as illustrated in FIG. 12C. The division may be performed, for example, such that the vertically long small zone 52y and the horizontally long small zone 52x have the same area.

By dividing the irradiation region 52 as described above, the irradiation light 50 can be applied in the optimum exposure amount in accordance with the distance between the center of the shot region and each small zone in a simplified manner.

Sixth Embodiment

Figure 13A:
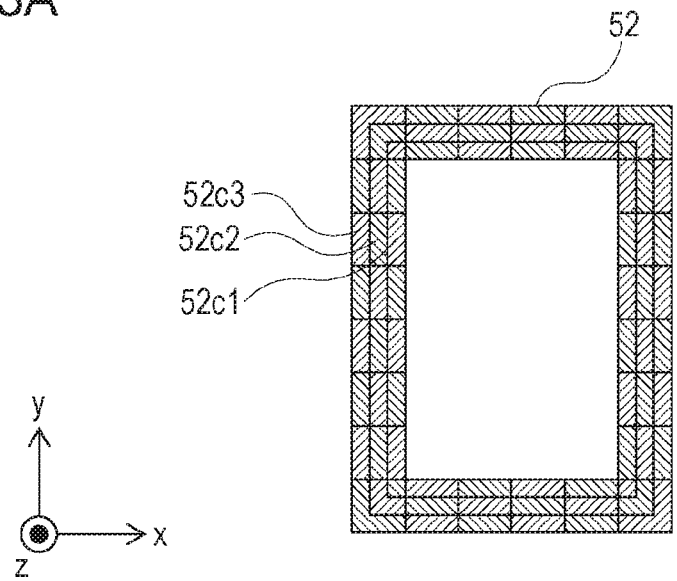
FIG. 13A illustrates individual irradiation zones and irradiation timings in a sixth embodiment.

A sixth embodiment is described in connection with the case in which small zones in the irradiation region 52 have different shapes from those of the small zones in the irradiation region 52 described in the above embodiments. In the sixth embodiment, as illustrated in FIG. 13A, the small zones 52a to 52n in the irradiation region 52 described with reference to FIG. 8 in the first embodiment are each further divided in a manner of dividing the irradiation region 52 in a direction outward from the center of the shot region. For example, as illustrated in FIG. 13A, the small zone 52c is divided into three smaller zones 52c1, 52c2 and 52c3 that are positioned successively as viewed from the center of the shot region. The number of the divided smaller zones may be set to a desired value, and the shape of each smaller zone may also be set to any suitable shape. The irradiation light 50 is applied to each smaller zone while the irradiation timing or the irradiation intensity is changed.

Figure 13B:
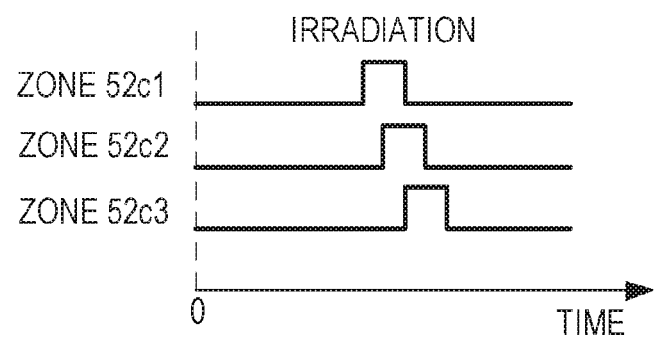
FIG. 13B illustrates the individual irradiation zones and the irradiation timings in the sixth embodiment.

FIG. 13A illustrates the irradiation region 52 in the sixth embodiment. Irradiation timings of the irradiation light 50 for the smaller zones 52c1, 52c2 and 52c3 in the irradiation region 52 in this case are represented in FIG. 13B. In other words, FIG. 13B illustrates irradiation timing charts for the smaller zones 52c1, 52c2 and 52c3. The horizontal axis indicates time. As illustrated in FIG. 13B, for example, the irradiation light 50 is successively applied to the smaller zones from one positioned on the inner side of the shot region. Although the above description referring to FIG. 13 has been made regarding only the small zone 52c illustrated in FIG. 8, the irradiation can be performed on all the small zones in the irradiation region 52 by successively applying the irradiation light 50 to smaller zones in each of the other small zones from the inner side in a similar manner.

The sixth embodiment can be further applied to the case of dividing the irradiation region 52 according to the manner described in any of the second to fifth embodiments without being limited to the first embodiment.

By dividing the irradiation region 52 as described above, the irradiation light 50 can be applied in the optimum exposure amount in accordance with spreading of the contact region between the pattern region 8a of the mold 8 and the imprint material 14 (i.e., with shift of the gas-liquid interface 14b).

Seventh Embodiment

A seventh embodiment provides an imprint apparatus in which the yield is increased by reducing the adhesion of the imprint material to the lateral surface 8b of the pattern region 8a and by preventing the failure in formation of the pattern and the damage of the mold 8. Furthermore, the seventh embodiment provides an imprint apparatus in which the pattern of the imprint material can be formed without reducing the filling-up performance of the imprint material to a zone where the insufficient filling-up tends to occur.

In the imprint apparatus 1 according to the above embodiment, if the irradiation light 50 is applied to corners of the shot region (pattern region 8a) as well, which are positioned near the lateral surface 8b, in the step 104 of FIG. 2, there is a possibility that defects due to the insufficient filling-up may generate because the imprint material 14 is hard to fully fill the corners. To cope with such a possibility, in an imprint apparatus 1 according to the seventh embodiment, the intensity of the irradiation light 50 for each of the corners (second zones) of the pattern region 8a is reduced in the step 104.

The light irradiation performed in the step 104 is described in detail below. FIG. 4 is the explanatory view referenced to explain the light irradiation performed in the step 104. As illustrated in FIG. 4A, the irradiation light 50 is applied to the peripheral region (irradiation region 52) including the lateral surface 8b that is the outer peripheral portion of the pattern region 8a of the mold 8. The irradiation light 50 is just required to be light capable of causing the polymerization reaction of the imprint material 14, and is not limited to ultraviolet light. If the imprint material 14 is cured by the irradiation light 50, the alignment cannot be performed in the step 105. Accordingly, the light irradiation in the step 104 is performed by applying the light to such an extent as increasing the viscosity of the imprint material 14 near the pattern region 8a without curing the imprint material 14. The wavelength, the irradiation time, the intensity and so on of the irradiation light 50 can be determined as appropriate in consideration of the material properties of the imprint material 14 and so on.

Figure 14A:
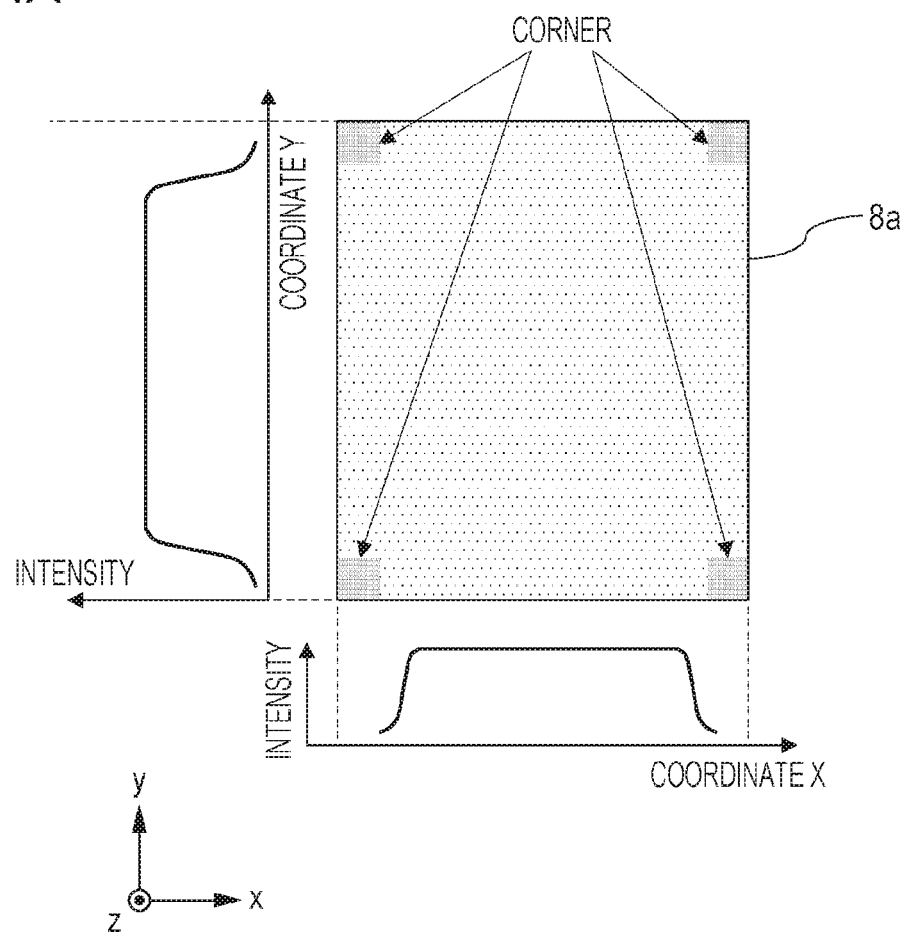
FIG. 14A illustrates a distribution of irradiation intensity in a seventh embodiment.

As illustrated in FIG. 14A, the imprint material is hard to fully fill the corners of the pattern region 8a. Taking into account such a point, in the seventh embodiment, the intensity of the irradiation light 50 applied to a position corresponding to the corner is reduced instead of uniformly applying the irradiation light 50 to the irradiation region 52 illustrated in FIG. 4B.

Figure 14B:
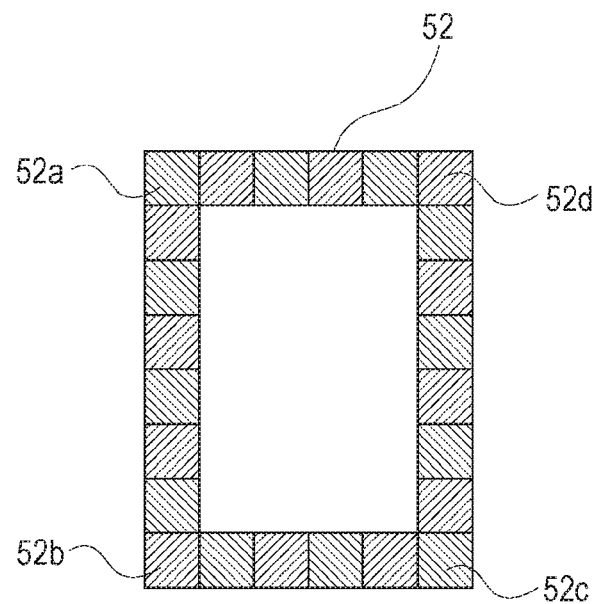
FIG. 14B illustrates the distribution of irradiation intensity in the seventh embodiment.

To that end, in the seventh embodiment, the irradiation region 52 is divided into a plurality of small zones as illustrated in FIG. 14B. Furthermore, the irradiation light 50 is applied to the small zones while the irradiation intensity is changed. With respect to the irradiation region 52, the irradiation zone and the irradiation intensity of the irradiation light 50 can be set by using the light modulator 53. Although FIG. 14B illustrates an example in which the irradiation region 52 is divided into square small zones consisting of eight zones in the vertical direction and six zones in the horizontal direction, the number of the divided small zones is not limited to such an example and it may be set to a desired value. Moreover, the shape of each small zone may be set to any other suitable shape such as a rectangular or triangular shape.

When the irradiation region 52 is divided into the plurality of small zones as illustrated in FIG. 14B, the intensity of the irradiation light 50 for the small zones 52a, 52b, 52c and 52d (second zones), for example, is set to be lower than that for other regions (first zones). At this time, the control unit 7 controls the light modulator 53 such that the intensity of the irradiation light 50 applied to the small zones 52a, 52b, 52c and 52d becomes lower than that of the irradiation light 50 applied to the other zones. Alternatively, the control unit 7 may control the light modulator 53 such that the irradiation light 50 is not applied to the small zones 52a, 52b, 52c and 52d. Here, the second zone is defined as a zone where the imprint material reaches the lateral surface of the pattern region of the mold at a time later than in the first zone when the mold and the imprint material are brought into contact.

By dividing the irradiation region and setting the intensity of the irradiation light 50 to be different between the corners and the other zones in the pattern region 8a as described above, reduction of the filling-up performance to the corners of the pattern region 8a can be avoided while the protrusion of the imprint material is reduced.

Eighth Embodiment

The filling-up performance of the imprint material is affected by the width of a pattern formed in the pattern region 8a. The imprint material is harder to fully fill a pattern, such as an alignment mark, of which concave portion has a larger width than that of the other concave-convex shape. Taking into account the above point, in an imprint apparatus 1 according to an eighth embodiment, the intensity of the irradiation light 50 for a zone in the irradiation region 52 where the pattern defining the concave portion of the larger width, such as the alignment mark, is formed is set to be lower than that for the other zone.

Figure 15A:
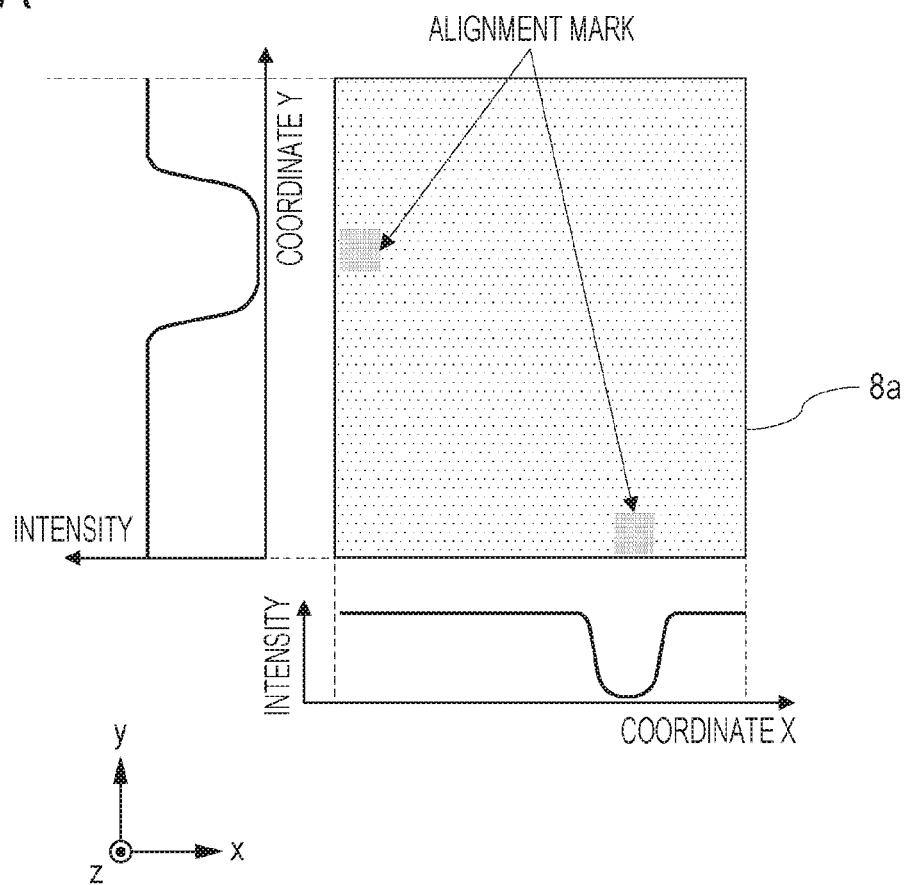
FIG. 15A illustrates a distribution of irradiation intensity in an eighth embodiment.

The imprint material is hard to fully fill the zone in the pattern region 8a where the alignment mark is formed as illustrated in FIG. 15A. Accordingly, in the eighth embodiment, the intensity of the irradiation light 50 at a position corresponding to the alignment mark is reduced instead of uniformly applying the irradiation light 50 to the irradiation region 52 illustrated in FIG. 15B.

Figure 15B:
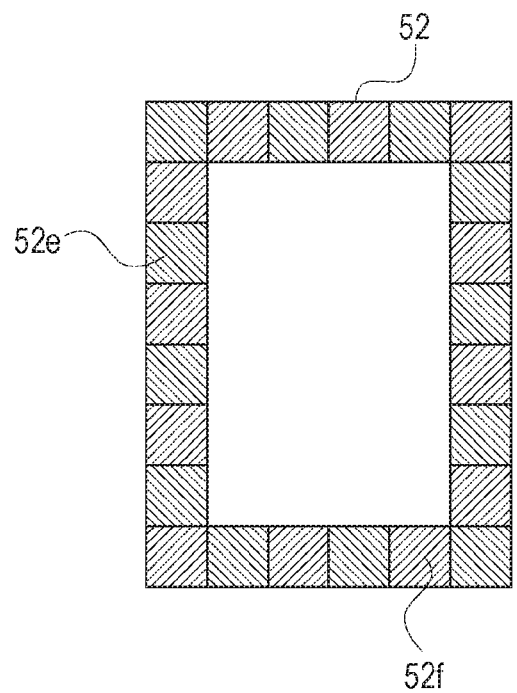
FIG. 15B illustrates the distribution of irradiation intensity in the eighth embodiment.

To that end, in the eighth embodiment, the irradiation region 52 is divided into a plurality of small zones as illustrated in FIG. 15B. Furthermore, the irradiation light 50 is applied to the small zones while the irradiation intensity is changed. With respect to the irradiation region 52, the irradiation zone and the irradiation intensity of the irradiation light 50 can be set by using the above-described light modulator 53. Although FIG. 15B illustrates an example in which the irradiation region 52 is divided into square small zones consisting of eight zones in the vertical direction and six zones in the horizontal direction, the number of the divided small zones is not limited to such an example and it may be set to a desired value. Moreover, the shape of each small zone may be set to any other suitable shape such as a rectangular or triangular shape.

When the irradiation region 52 is divided into the plurality of small zones as illustrated in FIG. 15B, the intensity of the irradiation light 50 for small zones 52e and 52f (second zones), for example, is set to be lower than that for other regions (first zones). At this time, the control unit 7 controls the light modulator 53 such that the intensity of the irradiation light 50 applied to the small zones 52e and 52f becomes lower than that of the irradiation light 50 applied to the other small zones. Alternatively, the control unit 7 may control the light modulator 53 such that the irradiation light 50 is not applied to the small zones 52e and 52f. Here, the second zone is defined as a zone where the imprint material reaches the lateral surface of the pattern region of the mold at a time later than in the first zone when the mold and the imprint material are brought into contact. In particular, the region including the zone where the alignment mark is formed is defined as the second zone.

By dividing the irradiation region and setting the intensity of the irradiation light 50 to be different between the alignment mark zones and the other zones in the pattern region 8a as described above, reduction of the filling-up performance to the alignment mark zones in the pattern region 8a can be avoided while the protrusion of the imprint material is reduced. The intensity of the irradiation light 50 may be reduced not only for the alignment mark zones, but also for another zone where, among concave patterns formed in the mold, a pattern having a relatively large width is formed. Also in such a case, the protrusion of the imprint material can be reduced while the filling-up performance of the imprint material is maintained.

Ninth Embodiment

The imprint apparatuses according to the seventh and eighth embodiments have been described in connection with the case in which the intensity of the irradiation light 50 is set to be distributed depending on the presence of the zone where the imprint material is hard to fully fill the pattern region 8a. An imprint apparatus according to a ninth embodiment is described in connection with the case in which the intensity of the irradiation light 50 is set to be distributed depending on the presence of a zone where the imprint material tends to easily protrude from the pattern region 8a (namely, a zone where the imprint material reaches the lateral surface of the pattern region of the mold at an earlier time than in another zone).

A tendency for the imprint material to protrude (in another expression, a difference in time at which the imprint material reaches the lateral surface of the pattern region of the mold) is affected by the direction of a pattern formed in the pattern region 8a. As illustrated in FIG. 16, for example, when a droplet of the imprint material 14 and the mold 8 come into contact with each other, the imprint material tends to spread in the pattern direction of the concave-convex pattern formed in the pattern region 8a. Accordingly, the imprint material is more apt to protrude when the end (lateral surface 8b) of the pattern region 8a is positioned across the pattern direction than when the end of the pattern region 8a is positioned along the pattern direction. Here, the pattern direction refers to a direction in which the concave-convex pattern in the form of lines extends. When the pattern includes a plurality of pattern directions, the direction of a pattern shape positioned closest to the end of the pattern region 8a may be defined as the pattern direction, or the pattern direction may be determined from an average of the directions of concave-convex shapes included in the pattern region.

As illustrated in FIG. 16, when the end of the pattern region 8a extends along the y direction, the imprint material having come into contact with the mold 8 is more apt to protrude from a zone (first zone) where the pattern direction is the x direction than a zone (second zone) where the pattern direction is the y direction. Taking into account the above point, the intensity of the irradiation light 50 may be set to be distributed by increasing the intensity of the irradiation light 50 for the zone where the imprint material is more apt to protrude. Alternatively, the intensity of the irradiation light 50 may be set to be distributed by decreasing the intensity of the irradiation light 50 for the zone where the imprint material is less apt to protrude. The intensity of the irradiation light 50 may be set to be distributed in accordance with not only the pattern direction, but also the pattern density. Here, the second zone is defined as a zone where the imprint material reaches the lateral surface of the pattern region of the mold at a time later than in the first zone when the mold and the imprint material are brought into contact.

The tendency of protrusion and the filling-up performance of the imprint material at the end of the pattern region (i.e., the end of the shot region) are different depending on the pattern direction. Accordingly, by setting the intensity of the irradiation light 50 to be distributed in accordance with the pattern direction as described above, the protrusion of the imprint material can be reduced while the filling-up performance of the imprint material is maintained.

Tenth Embodiment

An imprint apparatus according to a tenth embodiment is described in connection with the case in which the intensity of the irradiation light 50 is set to be distributed depending on the presence of a zone where the imprint material tends to easily protrude from the pattern region 8a.

Figure 17:
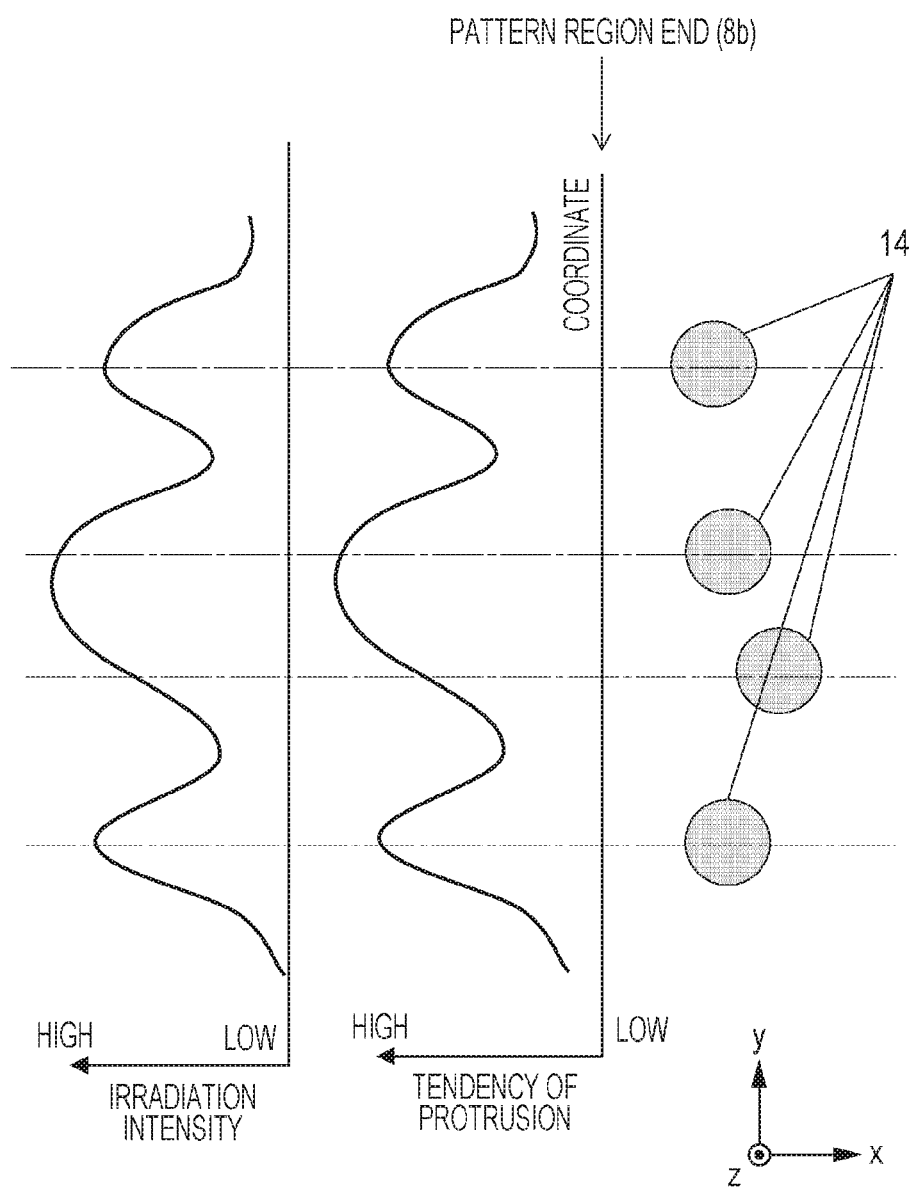
FIG. 17 illustrates a distribution of irradiation intensity in a tenth embodiment.

The tendency for the imprint material to protrude is affected by the location of a droplet of the imprint material near the end of the shot region. As illustrated in FIG. 17, for example, the imprint material 14 is more apt to protrude as the distance between a dropped position of the droplet of the imprint material 14 and the end of the pattern region 8a (i.e., the end of the shot region) is shorter. Furthermore, the imprint material 14 is more apt to protrude in a zone where the density of droplets of the imprint material 14 laid on the substrate is higher.

Taking into account the above point, the irradiation intensity of the irradiation light 50 is set to be distributed such that the irradiation intensity for a zone (first zone) where the distance between the dropped position of the droplet of the imprint material 14 and the end of the shot region is relatively short is higher than for the other zone (second zone). As an alternative, the intensity of the irradiation light 50 may be set to be distributed by reducing the intensity of the irradiation light 50 for the zone where the imprint material is less apt to protrude (i.e., the zone where the imprint material reaches the lateral surface of the pattern region of the mold at a time later than in the first zone). Similarly, the irradiation intensity of the irradiation light 50 may be set to be distributed such that the irradiation intensity for a zone (first zone) where the density of the droplets of the imprint material 14 is relatively high is higher than for the other zone (second zone). The irradiation intensity of the irradiation light 50 may be set to be distributed in accordance with information regarding an amount of the imprint material instead of the density of the droplets. Here, the second zone is defined as a zone where the imprint material reaches the lateral surface of the pattern region of the mold at a time later than in the first zone when the mold and the imprint material are brought into contact.

The tendency of protrusion and the filling-up performance of the imprint material at the end of the pattern region (i.e., the end of the shot region) are different depending on the location of the droplet of the imprint material 14 that is supplied to the shot region on the substrate. Accordingly, by setting the intensity of the irradiation light 50 to be distributed in accordance with the distance between the dropped position of the droplet of the imprint material and the end of the pattern shot and in accordance with the density of the droplets as described above, the protrusion of the imprint material can be reduced while the filling-up performance of the imprint material is maintained.

Eleventh Embodiment

An imprint apparatus according to an eleventh embodiment is described in connection with the case in which the intensity of the irradiation light 50 is set to be distributed depending on the presence of a zone where the imprint material tends to easily protrude from the pattern region 8a.

Figure 18:
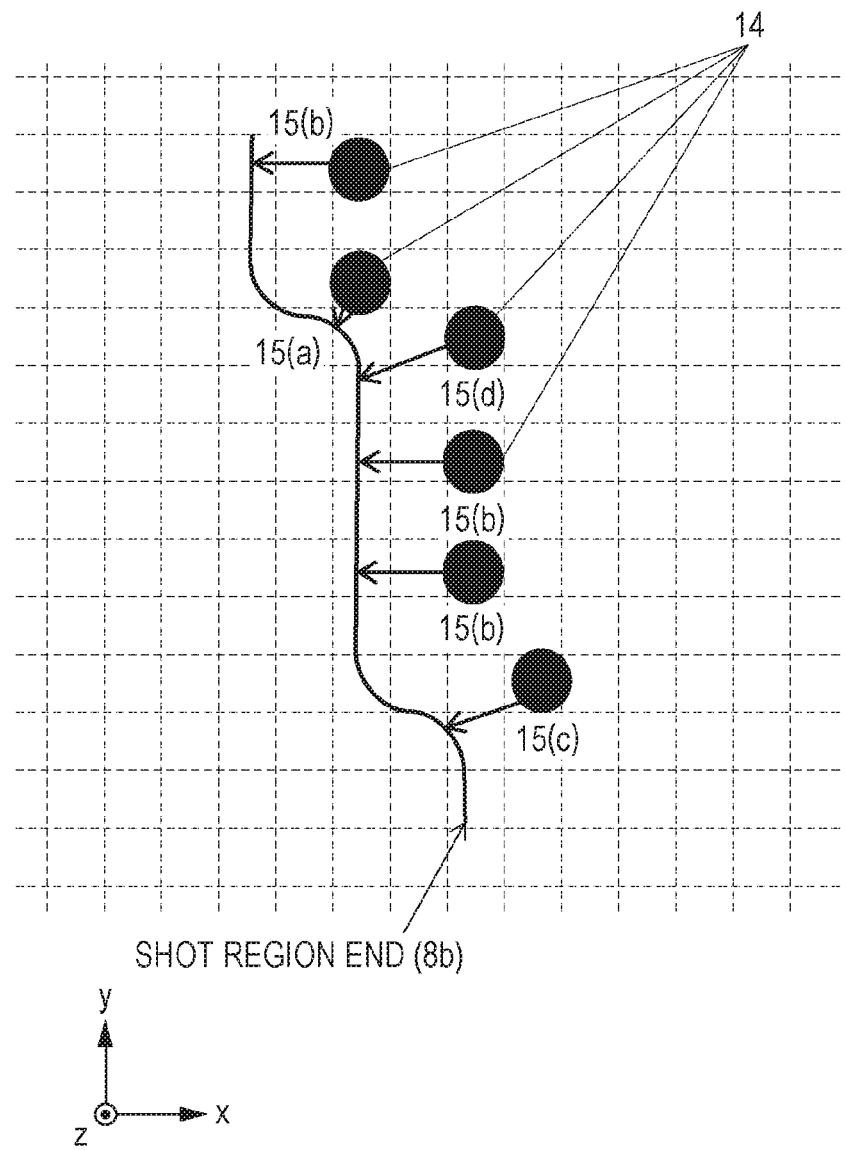
FIG. 18 illustrates droplet locations and a mold end in an eleventh embodiment.

The tendency for the imprint material to protrude is affected by not only the location of the droplet of the imprint material near the end of the shot region, but also the shape of the pattern region 8a formed in the mold 8. As illustrated in FIG. 18, for example, the shape of the end of the shot region is not always linear. Thus the tendency for the imprint material to protrude is affected by the distance between the end of the shot region and a dropped position of one among droplets of the imprint material supplied onto the substrate, the one droplet being positioned nearer to the end of the shot region.

Also when the end of the shot region has such a shape as illustrated in FIG. 18, for example, the imprint material 14 is more apt to protrude as the distance between the dropped position of the droplet of the imprint material 14 and the end of the shot region is shorter. In the case illustrated in FIG. 18, the dropped position of the droplet of the imprint material relative to the end of the shot region is gradually farther away from the end of the shot region in order of droplets 15(a), 15(b), 15(c) and 15(d). Taking into account the above point, the irradiation intensity of the irradiation light 50 is set to be distributed such that the irradiation intensity for a zone (first zone) where the distance between the dropped position of the droplet of the imprint material and the end of the shot region is shorter is higher than for the other zone (second zone). Here, the second zone is defined as a zone where the imprint material reaches the lateral surface of the pattern region of the mold at a time later than in the first zone when the mold and the imprint material are brought into contact.

The tendency for the imprint material to protrude at the end of the pattern region is different depending on not only the location of the droplet of the imprint material 14 that is supplied to the shot region on the substrate, but also the shape of the end of the pattern region. Accordingly, by setting the intensity of the irradiation light 50 to be distributed in accordance with the distance between the dropped position of the droplet of the imprint material and the end of the shot region as described above, the protrusion of the imprint material can be reduced while the filling-up performance of the imprint material is maintained.

Twelfth Embodiment

An imprint apparatus according to a twelfth embodiment is described in connection with the case in which the intensity of the irradiation light 50 is set to be distributed depending on the presence of a zone where the imprint material tends to easily protrude from the pattern region 8a.

Figure 19A:
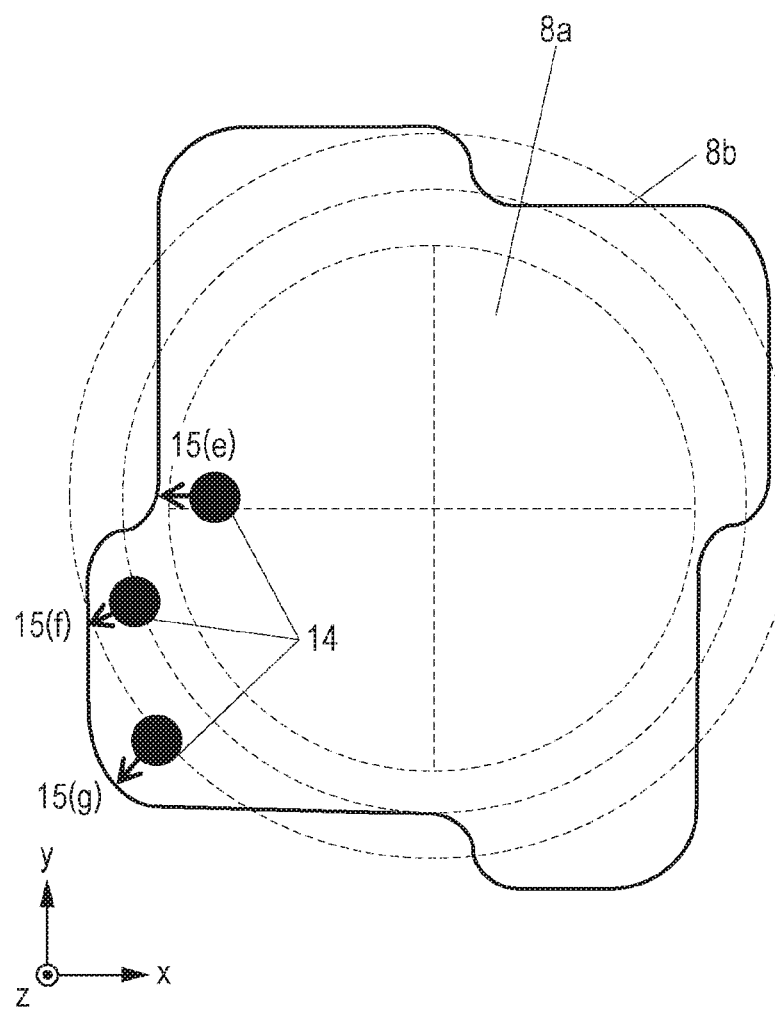
FIG. 19A illustrates droplet locations and a mold end in a twelfth embodiment.

The tendency for the imprint material to protrude is affected by an imprint time from a start time of contact between the imprint material 14 on the substrate and the pattern region 8a until the imprint material is cured. When the pattern region 8a of the mold 8 and the imprint material on the shot region are brought into contact in a fashion of gradually spreading outward from the center as denoted by dotted lines in FIG. 19A, the imprint time gradually increases in order of droplets 15(e), 15(f) and 15(g). When the position of the droplet relative to the end of the shot region and the imprint time are different for zones, the intensity of the irradiation light 50 is set to be distributed in accordance with the imprint time and the position of the end of the shot region.

Figure 19B:
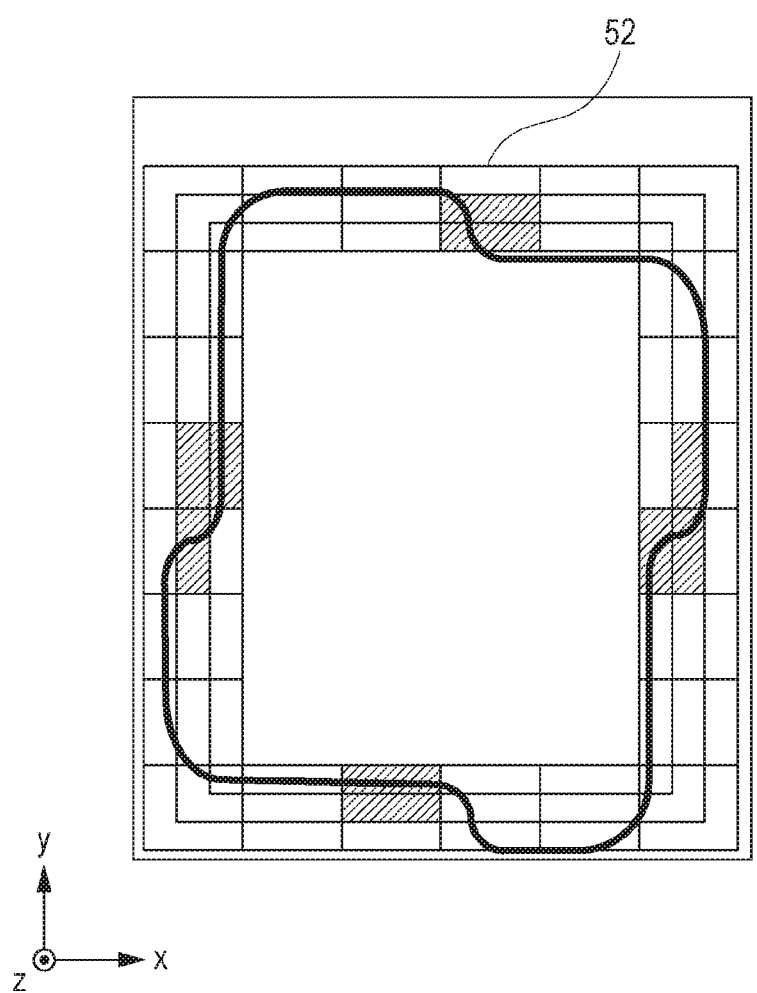
FIG. 19B illustrates the droplet locations and the mold end in the twelfth embodiment.

By dividing the irradiation region 52 into small zones along the direction outward from the center of the shot region as illustrated in FIG. 19B, the intensity of the irradiation light 50 can be set to be distributed in accordance with the shape of the pattern region 8a. The number of divided small zones in the irradiation region 52 may be optionally set, and the shape of each of the small zones may also be optionally set. Thus the irradiation intensity of the irradiation light 50 can be set to be distributed in accordance with an outer profile pattern of the shot region (pattern region 8a). Furthermore, the irradiation intensity of the irradiation light 50 can be set to be distributed in accordance with the imprint time during which the imprint material is held in contact with the pattern region 8a of the mold 8. For example, the irradiation intensity for a hatched zone (first zone) in the irradiation region 52 illustrated in FIG. 19B can be set to be higher than for the other zone (second zone). Here, the second zone is defined as a zone where the imprint material reaches the lateral surface of the pattern region of the mold at a time later than in the first zone (i.e., a zone where the imprint time is shorter) when the mold and the imprint material are brought into contact.

By setting the intensity of the irradiation light 50 to be distributed in accordance with the shape of the pattern region 8a of the mold 8 and the imprint time as described above, the protrusion of the imprint material can be reduced while the filling-up performance of the imprint material is maintained.

Thirteenth Embodiment

An imprint method according to a thirteenth embodiment is described in connection with the case of checking the presence of a zone where the imprint material tends to easily protrude from the pattern region 8a, and setting the intensity of the irradiation light 50 to be distributed in accordance with a checked result of the filling-up performance.

Figure 20:
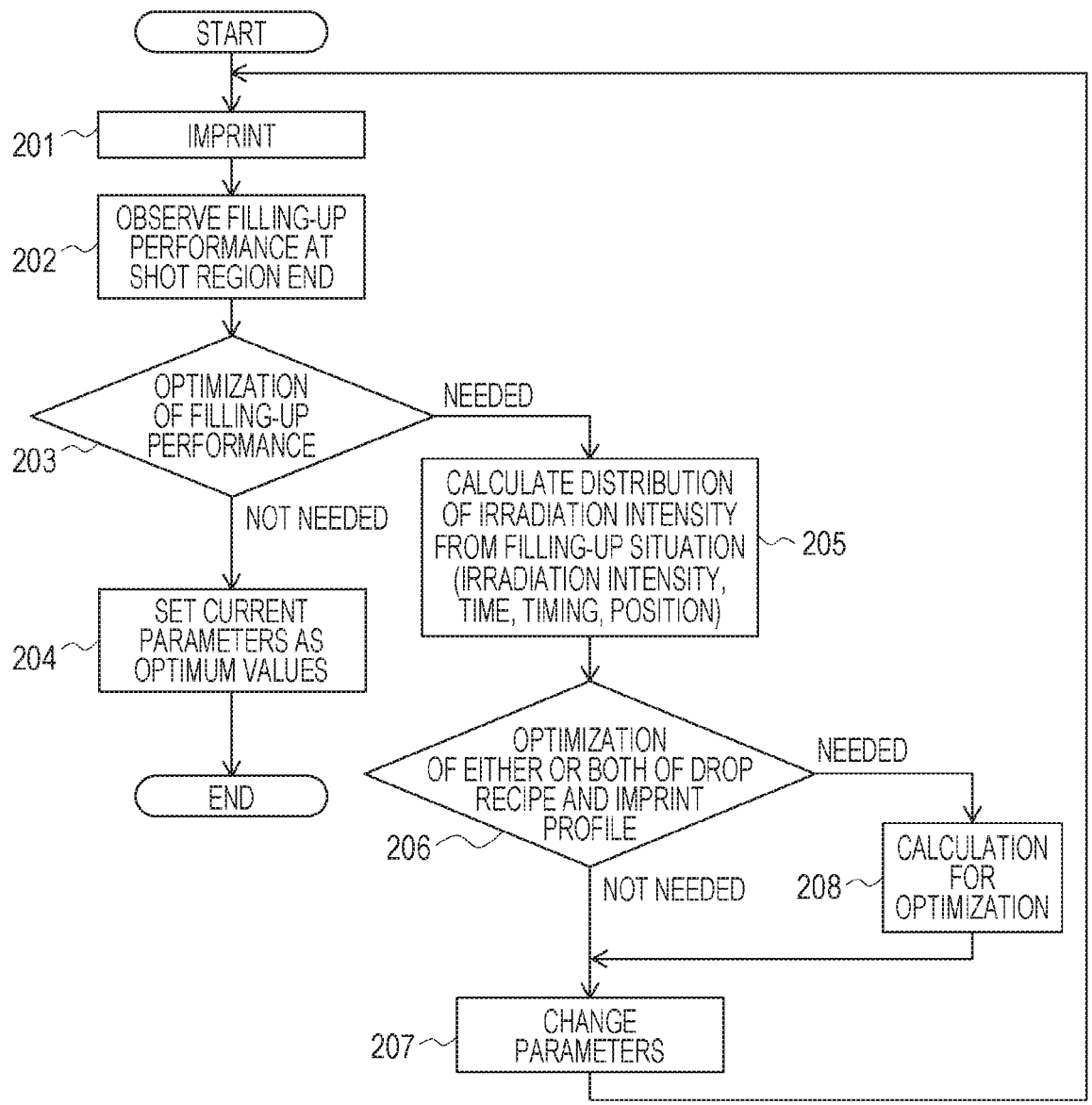
FIG. 20 is a flowchart of changing parameters in a thirteenth embodiment.

The imprint method according to the thirteenth embodiment is described with reference to a flowchart of FIG. 20. First, in step 201, a pattern of the imprint material is formed on the substrate by using the mold according to the imprint process described above with reference to FIG. 2. Then, in step 202, the filling-up performance at the end of the shot region for the pattern formed in the step 201 is observed. In step 203, whether a distribution of the irradiation intensity of the irradiation light needs to be optimized is determined from a result of the observation in the step 201. If it is determined in the step 203 that optimization of the filling-up performance is not needed, current parameters (distribution of the irradiation intensity) are set as optimum values in step 204.

If it is determined in the step 203 that the optimization of the filling-up performance is needed, the filling-up performance at the end of the pattern region is determined from layout information of the droplets and pattern conditions of the mold, and a distribution of the irradiation intensity of the irradiation light 50, including the irradiation intensity and the irradiation position, is calculated in step 205. Then, in step 207, the distribution of the irradiation intensity calculated in the step 205 is set as new parameters. In addition, the filling-up performance at the end of the shot region after the imprinting is checked, and it is determined in step 206 whether parameters, such as the layout information of the droplets and an imprint profile, need to be optimized. If the optimization is needed, the layout information of the droplets and so on can be optimized in step 208.

By repeating the imprint process and the steps of checking the filling-up performance and correcting the parameters as described above, the protrusion of the imprint material can be reduced while the filling-up performance of the imprint material is maintained.

Although any of the above embodiments has been described in connection with the imprint apparatus 1 using the light curing method, the imprint apparatus may cure the imprint material with heat without using the light curing method. In such a case, the imprint apparatus includes, as a curing unit, a heating unit for increasing the viscosity of the imprint material with heat instead of the optical system of applying the irradiation light to the imprint material in order to increase the viscosity of the imprint material. In the state in which the mold and the imprint material are in contact with each other, the heating unit (curing unit) heats the substrate such that the amount of heat per unit area applied to a portion of the imprint material corresponding to the first zone is larger than that applied to a portion of the imprint material corresponding to the second zone.

Embodiment of Planarizing Apparatus

An embodiment of a planarizing apparatus to which the present invention is applied will be described below with reference to FIG. 21. While the above-described embodiments use the method of transferring the pattern previously drawn on the mold (original plate or template) to the substrate (wafer), the concave-convex pattern is not formed in a mold (planar plate) used in this embodiment. An underlying pattern on the substrate has an uneven profile attributable to a pattern formed in a preceding step. In particular, some of process wafers have a level difference of about 1100 nm with a recent trend toward a multilayer structure of memory elements. The level difference caused by gentle undulation over the entire substrate can be compensated for by the focus tracking function of a scanning exposure apparatus used in an exposure step. However, unevenness with a fine pitch smaller than an exposure slit area of the exposure apparatus entirely falls within the DOF (Depth Of Focus) of the exposure apparatus. A method of forming a planarization layer, such as SOC (Spin On Carbon) or CMP (Chemical Mechanical Polishing), is used as the related-art method of planarizing the underlying pattern on the substrate. However, the related-art method has the problem that an unevenness suppression rate is 40% to 70% in a boundary portion between an isolated pattern region A and a repeated Dense pattern (line & space pattern concentrated) region B illustrated in FIG. 21A, and that sufficient planarization performance cannot be obtained. Additionally, an unevenness level of the underlying pattern caused by the multilayer structure tends to further increase in future.

As a solution to the above-described problem, U.S. Pat. No. 9,415,418 proposes a method of forming a continuous film by applying a resist, which becomes a planarization layer, with an inkjet dispenser, and by pressing the resist layer with a planar template. Furthermore, U.S. Pat. No. 8,394,282 proposes a method of reflecting a topography measurement result obtained for the wafer on density information per position, the density information being instructed by the inkjet dispenser when the resist is applied. In this embodiment, the present invention is applied to a planarizing (flattening) apparatus that performs local planarization in a substrate surface by pressing a planar template (mold) against an uncured resist (imprint material or uncured resin) which has been applied in advance.

Figure 21A:
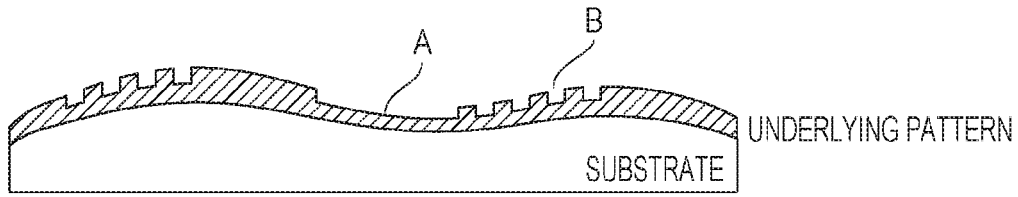
FIG. 21A illustrates a step of a planarizing process.

FIG. 21A illustrates a substrate before start of a planarization process. The region A represents an isolated pattern area in which an area of a convex portion in a pattern is relatively small, and the region B represents a Dense area in which a ratio of an area occupied by the convex portion in the pattern and an area occupied by a concave portion in the pattern is 1:1. Average heights in the region A and the region B have different values in accordance with proportions of the convex portion.

Figure 21B:
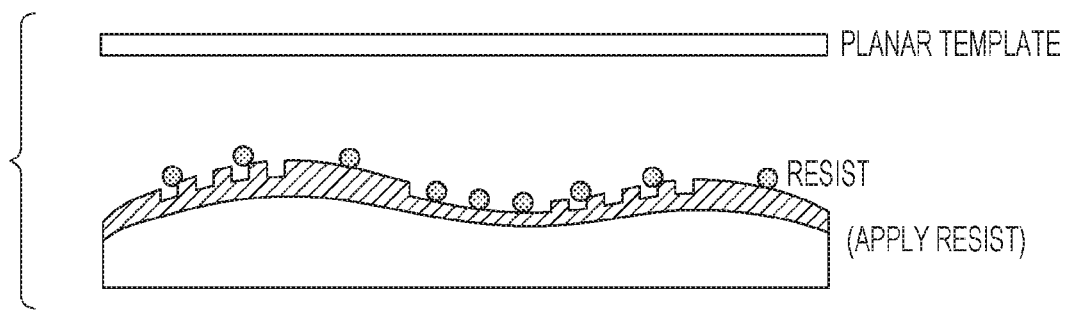
FIG. 21B illustrates another step of the planarizing process.

FIG. 21B illustrates a state in which a resist forming a planarization layer is applied to the substrate. Although FIG. 21B illustrates the state in which the resist is applied by an inkjet dispenser according to U.S. Pat. No. 9,415,418, the present invention can also be applied to the case of coating the resist with a spin coater. In other words, the present invention can be applied to any process including a step of bringing the planar template into contact with the uncured resist, coated in advance, for planarization.

Figure 21C:
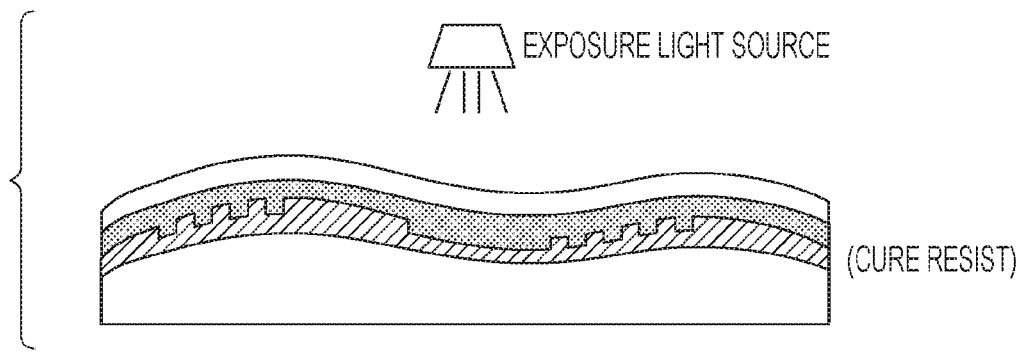
FIG. 21C illustrates still another step of the planarizing process.

FIG. 21C illustrates a step in which the resist is cured with irradiation of exposure light from an exposure light source with the planar template made of glass or quartz through which ultraviolet rays pass. At this time, the planar template is deformed following a surface profile of the substrate with respect to moderate unevenness over the entire substrate.

Figure 21D:
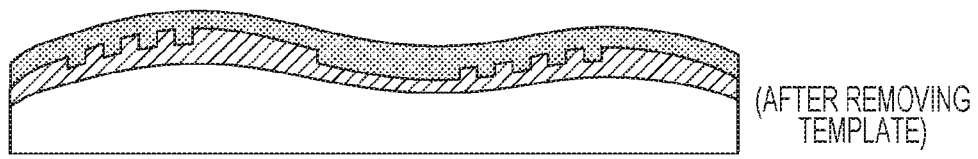
FIG. 21D illustrates still another step of the planarizing process.

FIG. 21D illustrates a state in which the planar template is removed after the curing of the resist.

Thus, the present invention can be applied to the embodiment of the planarizing apparatus as well, and in the case of using a mold (planar template) with a mesa portion including no pattern, it is possible to reduce protrusion of the resist (imprint material) from the mesa portion as in the above embodiments.

The above embodiments have been each described in connection with the case in which the gas-liquid interface 14b shifts evenly outward from the center of the pattern region (mesa portion) of the mold. However, the gas-liquid interface 14b does not always shift evenly (concentrically), and the time taken for the imprint material to reach the lateral surface of the pattern region may vary in some small zones depending on the position and the amount of the imprint material supplied onto the substrate. Accordingly, the control unit of the imprint apparatus may change the order of irradiation to the small zones in the irradiation region 52 in accordance with the position and the amount of the imprint material supplied onto the substrate.

Although the above embodiments have been each described in connection with the imprint apparatus 1 using the light curing method, the imprint apparatus may cure the imprint material with heat without using the light curing method. In such a case, the imprint apparatus includes, as the curing unit, the heating unit for increasing the viscosity of the imprint material with heat instead of the optical system of applying the irradiation light to the imprint material in order to increase the viscosity of the imprint material.

Article Manufacturing Method

A pattern of the cured material having been formed by the imprint apparatus is permanently used as at least a part in each of various articles, or temporarily used when various articles are manufactured. The articles refer to electric circuit elements, optical elements, MEMS, recording elements, sensors, molds, and so on. The electric circuit elements include, for example, volatile or nonvolatile semiconductor memories such as DRAM, SRAM, a flash memory, and MRAM, and semiconductor elements such as LSI, CCD, an image sensor, and FPGA. The molds include, for example, imprint molds.

The pattern of the cured material is used, as it is, as a constituent member at least in part of the article, or temporarily used as a resist mask. The resist mask is removed after, for example, etching or ion injection has been performed in a substrate processing step.

Figure 22A:
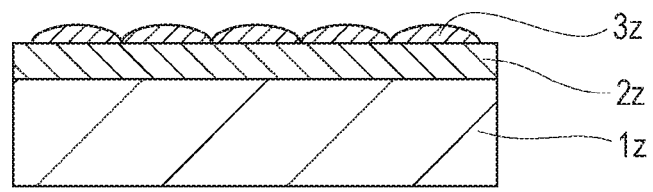
FIG. 22A is an explanatory view referenced to explain an article manufacturing method.

A practical article manufacturing method will be described below. As illustrated in FIG. 22A, a substrate 1z, such as a silicon wafer, including a processed material 2z, such as an insulator, formed on a substrate surface is prepared, and an imprint material 3z is applied to a surface of the processed material 2z by an inkjet method, for example. FIG. 22A illustrates a state in which the imprint material 3z is applied in the form of multiple droplets onto the substrate.

Figure 22B:
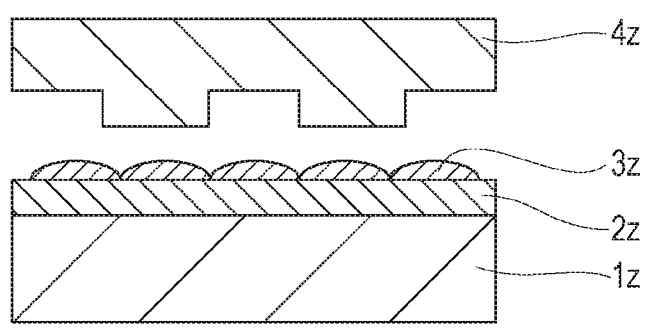
FIG. 22B is an explanatory view referenced to explain the article manufacturing method.
Figure 22C:
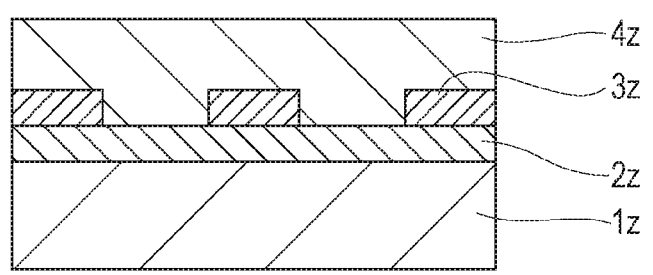
FIG. 22C is an explanatory view referenced to explain the article manufacturing method.

As illustrated in FIG. 22B, an imprint mold 4z is positioned in such that a mold surface where a concave-convex pattern is formed faces the imprint material 3z on the substrate. As illustrated in FIG. 22C, the mold 4z is brought into contact with the substrate 1z to which the imprint material 3z has been applied, and is then pressed against the mold 4z. The imprint material 3z is filled into a gap between the mold 4z and the processed material 2z. In that state, light is applied as curing energy to the imprint material 3z through the mold 4z, whereupon the imprint material 3z is cured.

Figure 22D:
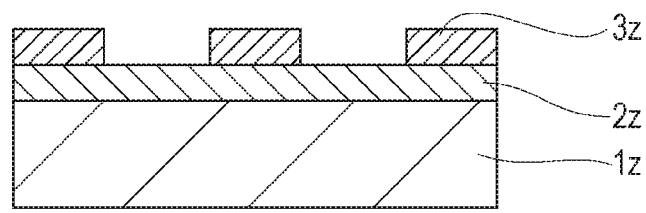
FIG. 22D is an explanatory view referenced to explain the article manufacturing method.

As illustrated in FIG. 22D, by releasing the mold 4z from the substrate 1z after the imprint material 3z has been cured, the pattern of the cured material, i.e., the cured imprint material 3z, is formed on the substrate 1z. In the pattern of the cured material, a convex portion of the cured material has a shape corresponding to that of a concave portion of the mold, and a concave portion of the cured material has a shape corresponding to that of a convex portion of the mold. Thus the concave-convex pattern of the mold 4z is transferred to the imprint material 3z.

Figure 22E:
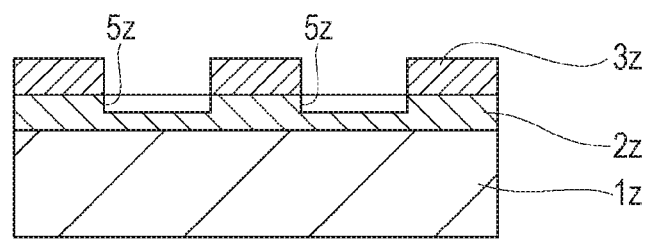
FIG. 22E is an explanatory view referenced to explain the article manufacturing method.
Figure 22F:
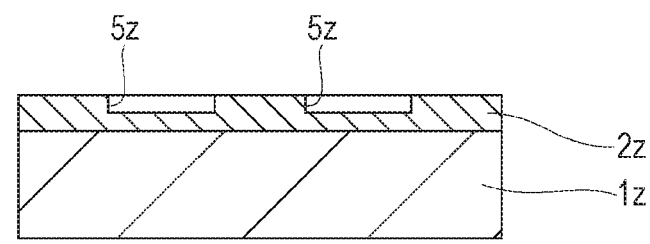
FIG. 22F is an explanatory view referenced to explain the article manufacturing method.

As illustrated in FIG. 22E, by performing etching with the pattern of the cured material used as an anti-etching mask, a portion of the surface of the processed material 2z where the cured material is absent or remains as a thin film is removed and formed as a groove 5z. Preferably, the remaining portion is removed in advance by another type of etching different from the above-described etching. As illustrated in FIG. 22F, by removing the pattern of the cured material, an article including the groove 5z formed in the surface of the processed material 2z can be obtained. While the pattern of the cured material is removed in the above-described case, the pattern may be utilized, instead of removing it after the above-described process, as an interlayer insulation film included in a semiconductor element, for example, namely as a component of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imprint apparatus forming a pattern composed of an imprint material on a substrate by using a mold including a pattern region, the imprint apparatus comprising:
   an optical system emitting irradiation light to irradiate the imprint material located on the substrate, the light emitted to a portion of the imprint material located underneath a peripheral region of the pattern region of the mold, and the emitted light reaching said portion of the imprint material through the said peripheral region of the mold, such that that an end of the pattern region is included in an irradiation region of the emitted light,
   the optical system including a light source that comprises at least one of a lamp, a laser diode or an LED; and
   a control unit programmed to control the optical system such that
   at a first point in time the irradiation light is applied to a first portion of the imprint material, after the first portion of the imprint material comes into contact with a first peripheral region of the pattern region of the mold,
   at a second point in time, the irradiation light is applied to a second portion of the imprint material, after the second portion of the imprint material comes into contact with a second peripheral region of the pattern region of the mold, and
   the emitted light acts to increase the viscosity of the imprint material on the substrate in the first and second peripheral regions without curing said imprint material,
   wherein
   the first peripheral region and the second peripheral region are both located in the peripheral region of the pattern region of the mold and the first peripheral region and the second peripheral region are different from each another, and
   the first point in time occurs earlier than the second point in time.

2. The imprint apparatus according to claim 1, further comprising an image capturing unit that captures a state in which the mold and the imprint material are in contact with each other, wherein the timing of applying the emitted light is set in accordance with times at which the imprint material comes into contact with the first peripheral region of the pattern region and the second peripheral region of the pattern region, respectively, the times being determined from results captured by the image capturing unit.

3. The imprint apparatus according to claim 1, wherein a distance between a center of a region in which the mold and the imprint material area are in contact with each other and the first peripheral region of the pattern region, is shorter than a distance between the center of the region in which the mold and the imprint material are in contact with each other and the second peripheral region of the pattern region.

4. The imprint apparatus according to claim 1, wherein a first and second timings of applying the emitted light is set in accordance with times at which the imprint material moving toward the peripheral region from the center of the region in which the mold and the imprint material are in contact with each other reaches the first peripheral region of the pattern region and the second peripheral region of the pattern region, respectively.

5. The imprint apparatus according to claim 1, wherein in a case where the pattern region is a rectangle, the second region of the pattern region includes a corner of the rectangle.

6. The imprint apparatus according to claim 1, wherein the first and second timings of applying the emitted light is set in accordance with a supply position of the imprint material supplied to the first peripheral region of the pattern region on the substrate and a supply position of the imprint material supplied to the second peripheral region of the pattern region of the substrate.

7. The imprint apparatus according to claim 1, wherein the optical system includes a light modulator that changes the timing of applying the emitted light.

8. An imprint apparatus forming a pattern composed of an imprint material on a substrate by using a mold including a pattern region, the imprint apparatus comprising:
　an optical system emitting irradiation light to irradiate the imprint material located on the substrate, the light emitted to a portion of the imprint material located underneath a peripheral region of the pattern region of the mold, and the emitted light reaching said portion of the imprint material through the said peripheral region of the mold, such that that an end of the pattern region is included in an irradiation region of the emitted light, the optical system including a light source that comprises at least one of a lamp, a laser diode or an LED; and
　a control unit programmed to control the optical system such that intensity of the irradiation light applied to the imprint material that comes into contact with a first region of the pattern region in the peripheral region is higher than intensity of the irradiation light applied to the imprint material that comes into contact with a second region of the pattern region in the peripheral region, out of which the imprint material is less likely to spread than the first region, and
　the emitted light acts to increase the viscosity of the imprint material on the substrate in the first and second regions of the pattern region in the peripheral region without curing said imprint material.

9. The imprint apparatus according to claim 8, wherein the optical system includes a digital micro mirror device that changes the intensity of the irradiation light between the first and second regions of the pattern region in the peripheral region.

10. The imprint apparatus according to claim 8, further comprising a light irradiation system applying curing light to cure the imprint material to the imprint material in contact with the pattern region through the mold, wherein the light irradiation system applies light to an entire region where the pattern region of the mold in which the mold and the substrate are aligned and the imprint material come in contact with each other.

11. A method of manufacturing an article, the method comprising steps of:
　forming a pattern on a substrate by using the imprint apparatus according to claim 8; and
　processing the substrate including the pattern having been formed thereon,
　the article being manufactured from the processed substrate.

12. An imprint apparatus forming a pattern composed of an imprint material on a substrate by using a mold including a pattern region, the imprint material comprising:
　an optical system emitting irradiation light to irradiate the imprint material located on the substrate, the light emitted to a portion of the imprint material located underneath a peripheral region of the pattern region of the mold, and the emitted light reaching said portion of the imprint material through the said peripheral region of the mold, such that that an end of the pattern region is included in an irradiation region of the emitted light, the optical system including a light source that comprises at least one of a lamp, a laser diode or an LED; and
　a control unit programmed to control the optical system such that,
　in a case where the pattern region is a rectangle, intensity of the irradiation light applied to the imprint material that comes into contact with a corner of the pattern region in the peripheral region is lower than intensity of the irradiation light applied to the imprint material that comes into contact with a region different from the corner of the pattern region in the peripheral region, and
　the emitted light acts to increase the viscosity of the imprint material on the substrate in the corner of the pattern region in the peripheral region different from the corner of the pattern region in the peripheral region without curing said imprint material.

13. A method of manufacturing an article, the method comprising steps of:
　forming a pattern on a substrate by using the imprint apparatus according to claim 12; and
　processing the substrate including the pattern having been formed thereon,
　the article being manufactured from the processed substrate.

14. An imprint apparatus forming a pattern composed of an imprint material on a substrate by using a mold including a pattern region, the imprint apparatus comprising:
　an optical system emitting irradiation light to irradiate the imprint material located on the substrate, the light emitted to a portion of the imprint material located underneath a peripheral region of the pattern region of the mold, and the emitted light reaching said portion of the imprint material through the said peripheral region of the mold, such that that an end of the pattern region is included in an irradiation region of the emitted light, the optical system including a light source that comprises at least one of a lamp, a laser diode or an LED; and
　a control unit programmed to control the optical system such that intensity of the irradiation light applied to the imprint material that comes into contact with a region including an alignment mark formed on the mold in the peripheral region is lower than intensity of the irradiation light applied to the imprint material that comes into contact with a region different from the region including the alignment mark formed on the mold in the peripheral region, and
　the emitted light acts to increase the viscosity of the imprint material on the substrate in the region including an alignment mark formed on the mold in the peripheral region and the region different from the region including the alignment mark formed on the mold in the peripheral region, without curing said imprint material.

15. A method of manufacturing an article, the method comprising steps of:
　forming a pattern on a substrate by using the imprint apparatus according to claim 14; and
　processing the substrate including the pattern having been formed thereon, the article being manufactured from the processed substrate.

16. An imprint apparatus forming a pattern composed of an imprint material on a substrate by using a mold including a pattern region, the imprint apparatus comprising:
an optical system emitting irradiation light to irradiate the imprint material located on the substrate, the light emitted to a portion of the imprint material located underneath a peripheral region of the pattern region of the mold, and the emitted light reaching said portion of the imprint material through the said peripheral region of the mold, such that that an end of the pattern region is included in an irradiation region of the emitted light, the optical system including a light source that comprises at least one of a lamp, a laser diode or an LED; and
a control unit programmed to control the optical system such that intensity of the irradiation light applied to the imprint material that comes into contact with a region including a linear pattern extending along a direction intersecting with an end of the pattern region in the peripheral region is higher than intensity of the irradiation light applied to the imprint material that comes into contact with a region including a linear pattern extending along the end of the pattern region in the peripheral region, and
the emitted light acts to increase the viscosity of the imprint material on the substrate in the region including a linear pattern extending along a direction intersecting with an end of the pattern region and the region including a linear pattern extending along the end of the pattern region in the peripheral region, without curing said imprint material.

17. A method of manufacturing an article, the method comprising steps of:
forming a pattern on a substrate by using the imprint apparatus according to claim 16; and
processing the substrate including the pattern having been formed thereon,
the article being manufactured from the processed substrate.

18. An imprint apparatus forming a pattern composed of an imprint material on a substrate by using a mold including a pattern region, the imprint apparatus comprising:
an optical system emitting irradiation light to irradiate the imprint material located on the substrate, the light emitted to a portion of the imprint material located underneath a peripheral region of the pattern region of the mold, and the emitted light reaching said portion of the imprint material through the said peripheral region of the mold, such that that an end of the pattern region is included in an irradiation region of the emitted light, the optical system including a light source that comprises at least one of a lamp, a laser diode or an LED; and
a control unit programmed to control the optical system such that intensity of the irradiation light applied to the imprint material that comes into contact with a first region of the pattern region in the peripheral region is higher than intensity of the irradiation light applied to the imprint material that comes into contact with a second region of the pattern region in the peripheral region in which a distance from the end of the pattern region to a dropped position of a droplet of the imprint material supplied on the substrate is longer than that in the first region, and
the emitted light acts to increase the viscosity of the imprint material on the substrate in the first and second regions of the pattern region in the peripheral region without curing said imprint material.

19. A method of manufacturing an article, the method comprising steps of:
forming a pattern on a substrate by using the imprint apparatus according to claim 18; and
processing the substrate including the pattern having been formed thereon,
the article being manufactured from the processed substrate.

20. An imprint apparatus forming a pattern composed of an imprint material on a substrate by using a mold including a pattern region, the imprint apparatus comprising:
a heating unit increasing viscosity of a portion of the imprint material located underneath a peripheral region of the pattern region of the mold, so that an end of the pattern region is included in a region in which the viscosity of the imprint material on the substrate is increased; and a control unit programmed to control the heating unit such that an amount of heat per unit area applied to the imprint material that comes into contact with a first region of the pattern region in the peripheral region is larger than an amount of heat per unit area applied to the imprint material that comes into contact with a second region of the pattern region in the peripheral region, out of which the imprint material is less likely to spread than the first region,
wherein the viscosity of the imprint material on the substrate that comes into contact with the first region of the pattern region in the peripheral region and that comes into contact with the second region of the pattern region in the peripheral region is increased without curing said imprint material.

21. An imprint apparatus forming a pattern composed of an imprint material on a substrate by using a mold including a pattern region, the imprint apparatus comprising:
a heating unit increasing viscosity of a portion of the imprint material located underneath a peripheral region of the pattern region of the mold, so that an end of the pattern region is included in a region in which the viscosity of the imprint material on the substrate is increased; and
a control unit programmed to control the heating unit such that, in a case where the pattern region is a rectangle, an amount of heat per unit area applied to the imprint material that comes into contact with a corner of the pattern region in the peripheral region is smaller than an amount of heat per unit area applied to the imprint material that comes into contact with a region different from the corner of the pattern region in the peripheral region,
wherein the viscosity of the imprint material on the substrate that comes into contact with the corner of the pattern region in the peripheral region and that comes into contact with the region different from the corner of the pattern region in the peripheral region is increased without curing said imprint material.

22. An imprint apparatus forming a pattern composed of an imprint material on a substrate by using a mold including a pattern region, the imprint apparatus comprising:
a heating unit increasing viscosity of a portion of the imprint material located underneath a peripheral region of the pattern region of the mold, so that an end of the pattern region is included in a region in which the viscosity of the imprint material on the substrate is increased; and a control unit programmed to control the heating unit such that an amount of heat per unit area applied to the imprint material that comes into contact with a region including an alignment mark formed on the mold in the peripheral region is smaller than an amount of heat per unit area applied to the imprint material that comes into contact with a region different from the region including the alignment mark formed on the mold in the peripheral region, wherein the viscosity of the imprint material on the substrate that comes into contact with the region including an alignment mark formed on the mold in the peripheral region and that comes into contact with the region different from the region including the alignment mark formed on the mold in the peripheral region is increased without curing said imprint material.

23. An imprint apparatus forming a pattern composed of an imprint material on a substrate by using a mold including a pattern region, the imprint apparatus comprising:
- a heating unit increasing viscosity of a portion of the imprint material located underneath a peripheral region of the pattern region of the mold, so that an end of the pattern region is included in a region in which the viscosity of the imprint material on the substrate is increased; and
- a control unit programmed to control the heating unit such that an amount of heat per unit area applied to the imprint material that comes into contact with a region including a linear pattern extending along a direction intersecting with an end of the pattern region in the peripheral region is larger than an amount of heat per unit area applied to the imprint material that comes into contact with a region including a linear pattern extending along the end of the pattern region in the peripheral region,
- wherein the viscosity of the imprint material on the substrate that comes into contact with the region including a linear pattern extending along a direction intersecting with an end of the pattern region in the peripheral region and that comes into contact with the region including a linear pattern extending along the end of the pattern region in the peripheral region is increased without curing said imprint material.

24. An imprint apparatus forming a pattern composed of an imprint material on a substrate by using a mold including a pattern region, the imprint apparatus comprising:
- a heating unit increasing viscosity of a portion of the imprint material located underneath a peripheral region of the pattern region of the mold, so that an end of the pattern region is included in a region in which the viscosity of the imprint material on the substrate is increased; and
- a control unit programmed to control the heating unit such that an amount of heat per unit area applied to the imprint material that comes into contact with a first region of the pattern region in the peripheral region is larger than an amount of heat per unit area applied to the imprint material that comes into contact with a second region of the pattern region in the peripheral region, a distance from the end of the pattern region to a dropped position of a droplet of the imprint material supplied on the substrate being longer in the second region than that in the first region,
- wherein the viscosity of the imprint material on the substrate that comes into contact with the first region of the pattern region in the peripheral region and that comes into contact with the second region of the pattern region in the peripheral region is increased without curing said imprint material.

25. A method of manufacturing an article, the method comprising steps of:
- forming a pattern on a substrate by using the imprint apparatus according to claim 1; and
- processing the substrate including the pattern having been formed thereon,
- the article being manufactured from the processed substrate.

* * * * *